(12) United States Patent
Hasegawa et al.

(10) Patent No.: US 12,482,579 B2
(45) Date of Patent: Nov. 25, 2025

(54) WIRING COMPONENT, MODULE, APPARATUS, AND METHOD FOR MANUFACTURING MODULE

(71) Applicant: CANON KABUSHIKI KAISHA, Tokyo (JP)

(72) Inventors: Mitsutoshi Hasegawa, Kanagawa (JP); Noritake Tsuboi, Kanagawa (JP); Satoru Higuchi, Tokyo (JP); Takashi Aoki, Chiba (JP); Koji Noguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 709 days.

(21) Appl. No.: 17/707,669

(22) Filed: Mar. 29, 2022

(65) Prior Publication Data

US 2022/0319737 A1    Oct. 6, 2022

(30) Foreign Application Priority Data

Mar. 31, 2021    (JP) .................................. 2021-059053

(51) Int. Cl.

| | |
|---|---|
| *H01B 7/08* | (2006.01) |
| *H05K 1/14* | (2006.01) |
| *H05K 1/18* | (2006.01) |
| *H05K 3/34* | (2006.01) |

(52) U.S. Cl.
CPC .......... *H01B 7/0823* (2013.01); *H01B 7/0846* (2013.01); *H05K 1/145* (2013.01); *H05K 3/3436* (2013.01); *H05K 1/18* (2013.01); *H05K 2201/10378* (2013.01); *H05K 2201/2036* (2013.01)

(58) Field of Classification Search
CPC .... H01B 7/0823; H01B 7/0846; H05K 1/144; H05K 1/145; H05K 1/18; H05K 2201/042; H05K 2201/10378; H05K 2201/2036; H05K 3/3436
See application file for complete search history.

(56) References Cited

U.S. PATENT DOCUMENTS

| | | |
|---|---|---|
| 2005/0243528 A1 | 11/2005 | Murayama |
| 2009/0009979 A1 | 1/2009 | Mori |
| 2012/0304768 A1 | 12/2012 | Sakuma |
| 2015/0003083 A1* | 1/2015 | Uehara .................... F21S 43/14 362/418 |
| 2015/0103500 A1* | 4/2015 | Bae ........................ H05K 1/111 228/102 |

(Continued)

FOREIGN PATENT DOCUMENTS

| | | |
|---|---|---|
| JP | 2001111232 A | 4/2001 |
| JP | 2002064271 A | 2/2002 |

(Continued)

*Primary Examiner* — Timothy J Thompson
*Assistant Examiner* — Rhadames Alonzo Miller
(74) *Attorney, Agent, or Firm* — Canon U.S.A., Inc. I.P. Division

(57) ABSTRACT

A wiring component includes a first wiring portion including a plurality of wirings arranged side by side in a first direction, a second wiring portion including a plurality of wirings arranged side by side in a second direction, and a coupling portion configured to couple the first wiring portion and the second wiring portion to each other, wherein an angle formed by the first direction and the second direction is changeable by deformation of the coupling portion.

11 Claims, 13 Drawing Sheets

(56) References Cited

U.S. PATENT DOCUMENTS

2018/0287275 A1    10/2018  Xu
2019/0281699 A1*   9/2019   Bae ........................ H05K 1/111
2020/0161271 A1    5/2020   Mori

FOREIGN PATENT DOCUMENTS

| JP | 2005183410 A |   | 7/2005 |            |
|----|--------------|---|--------|------------|
| JP | 2008177298 A |   | 7/2008 |            |
| JP | 2012054219 A | * | 3/2012 | ............ H01R 11/01 |
| JP | 2015029081 A |   | 2/2015 |            |

* cited by examiner

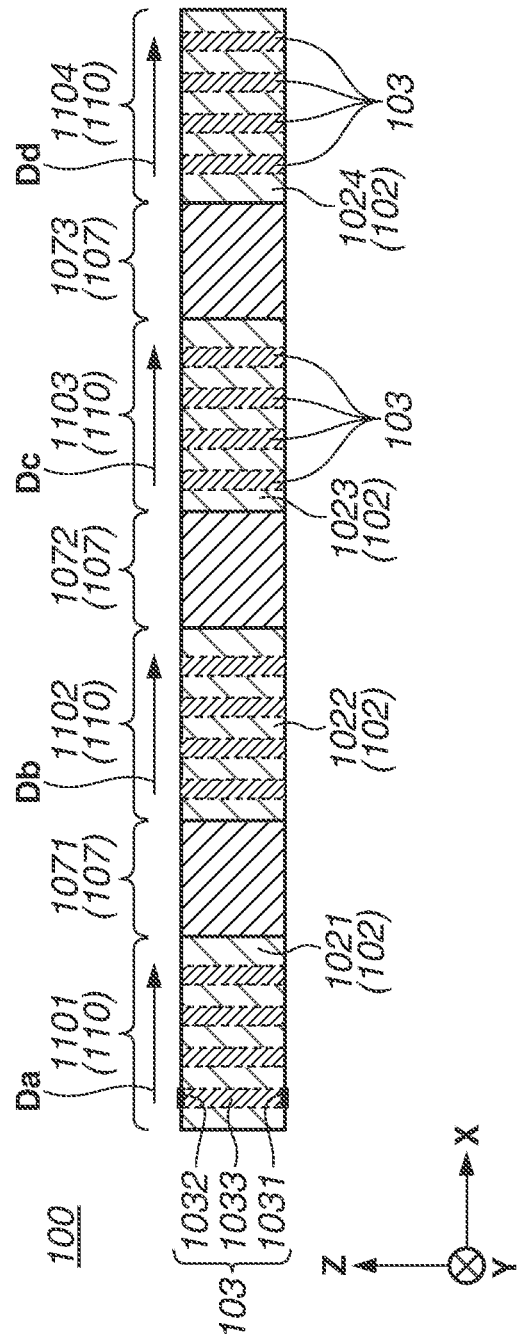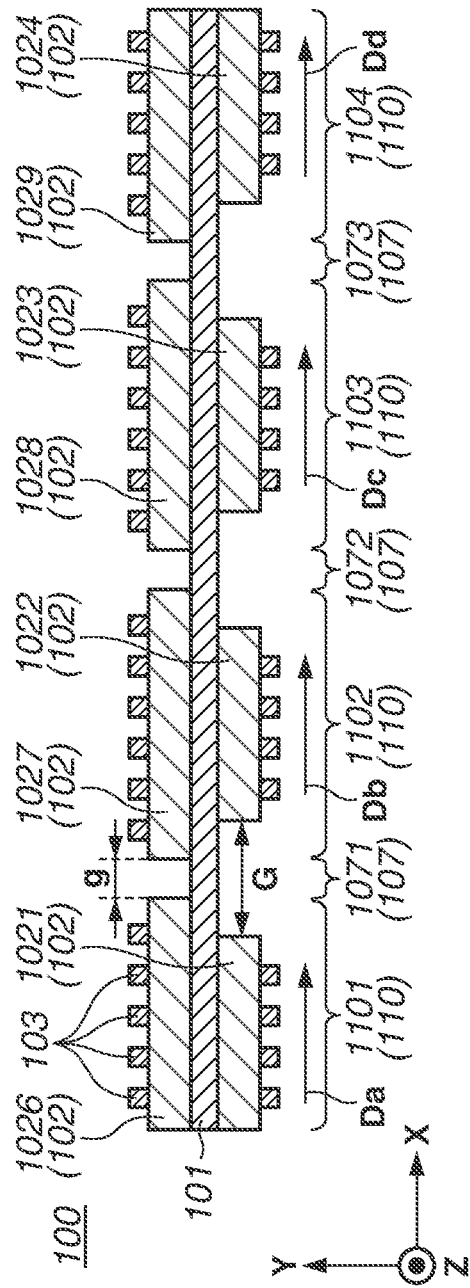

FIG.4A
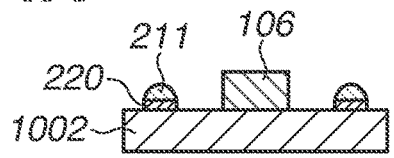 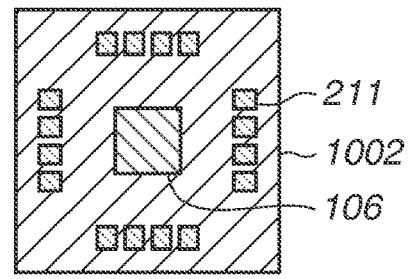
FIG.4B
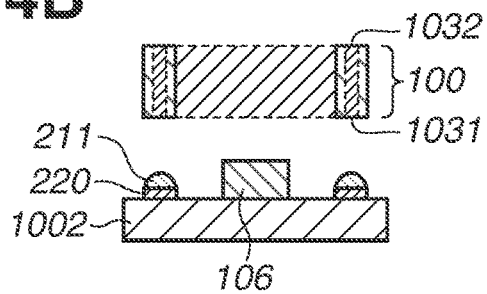 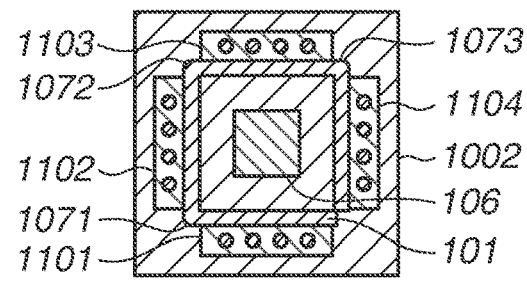
FIG.4C
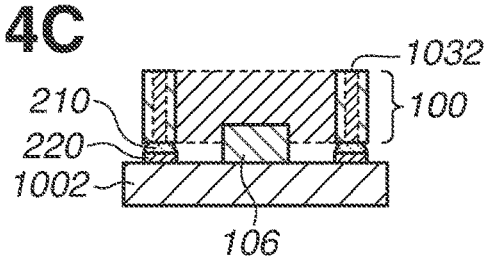 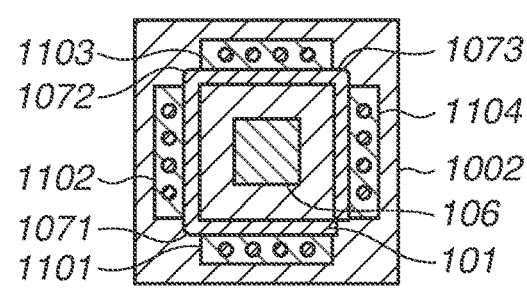
FIG.4D
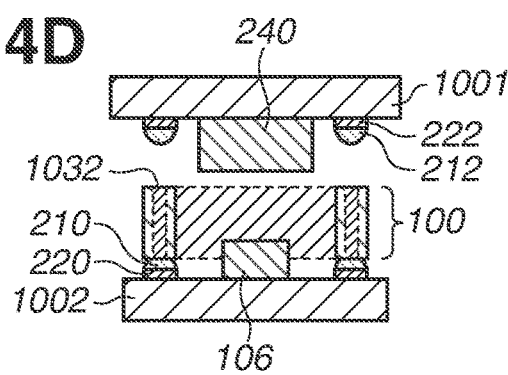 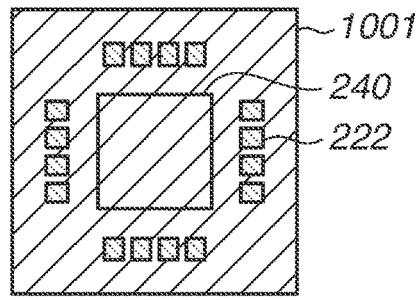
FIG.4E
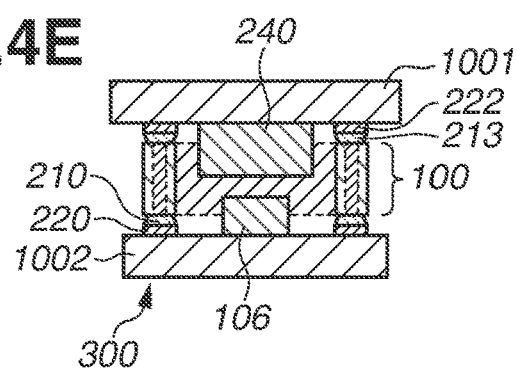 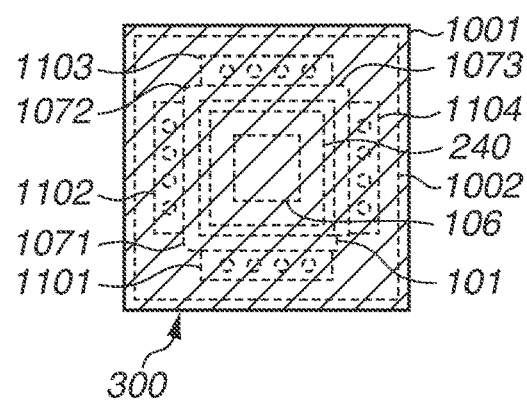

FIG.7A1
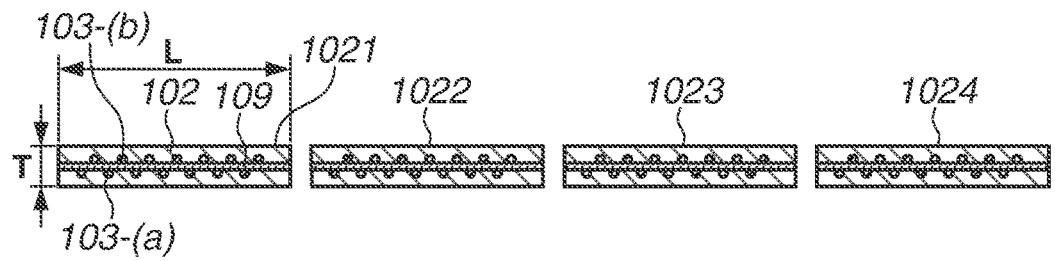
FIG.7A2
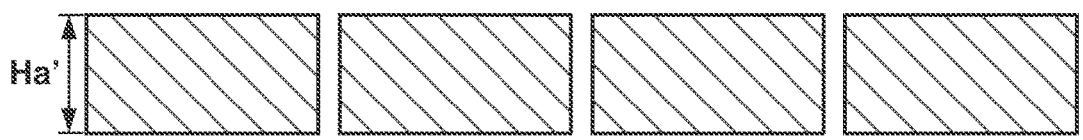
FIG.7B1
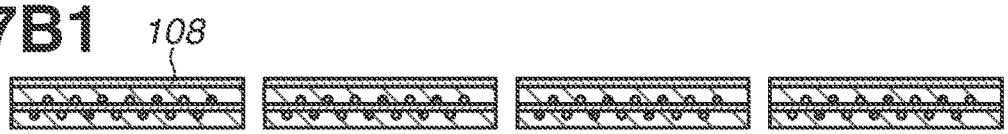
FIG.7B2
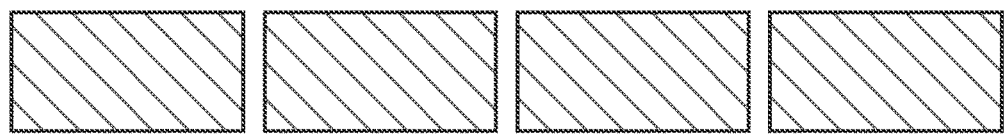
FIG.7C1
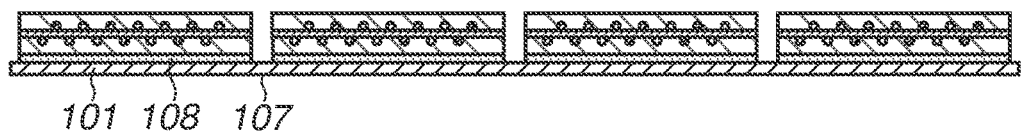
FIG.7C2
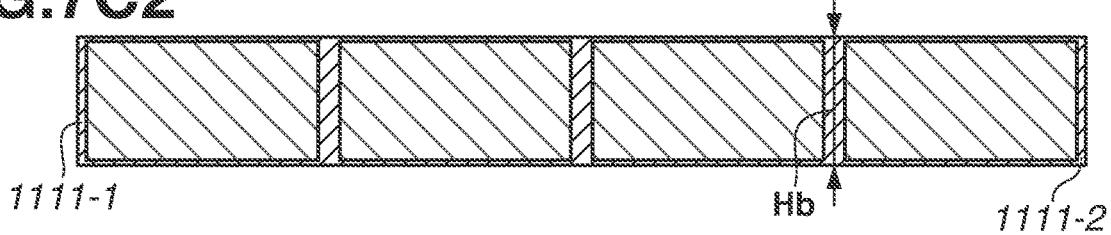

FIG.7D1
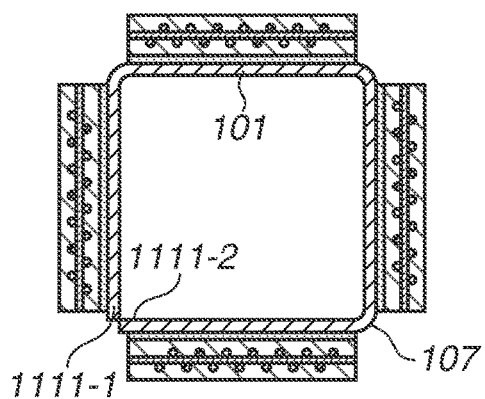
FIG.7E1
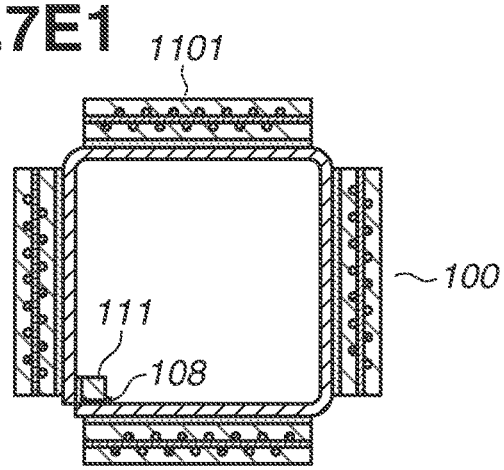
FIG.7D2
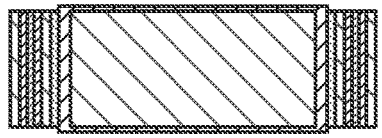
FIG.7E2

FIG.8A1
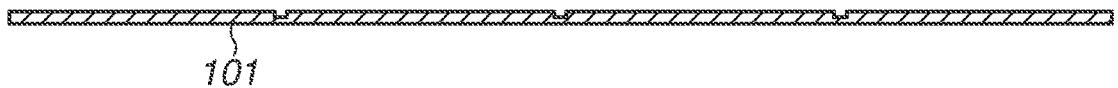
101
FIG.8A2
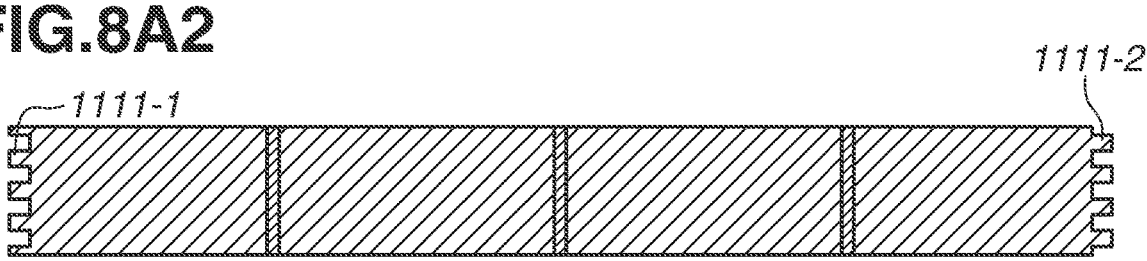
1111-1  1111-2
FIG.8B1
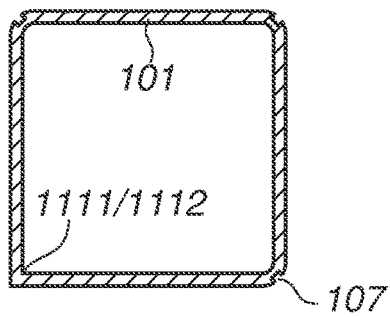
101
1111/1112
107
FIG.8B2
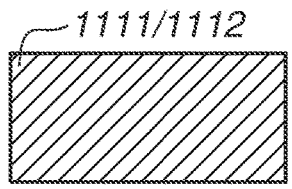
1111/1112

FIG.8C1
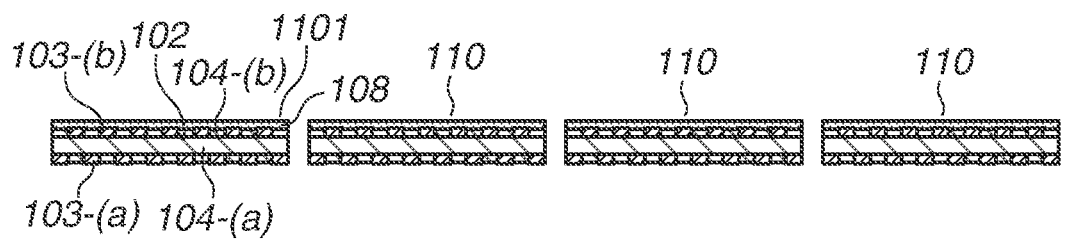
FIG.8C2
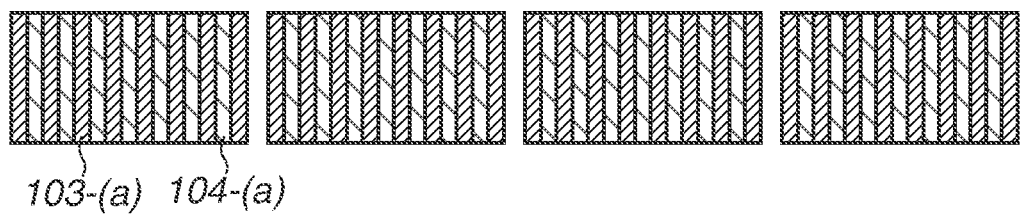
FIG.8D1
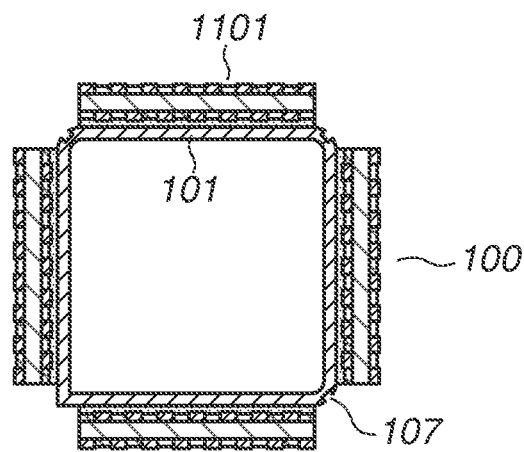
FIG.8D2
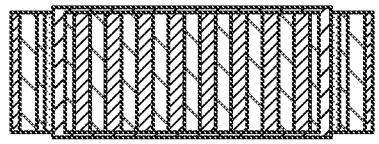

FIG.9A
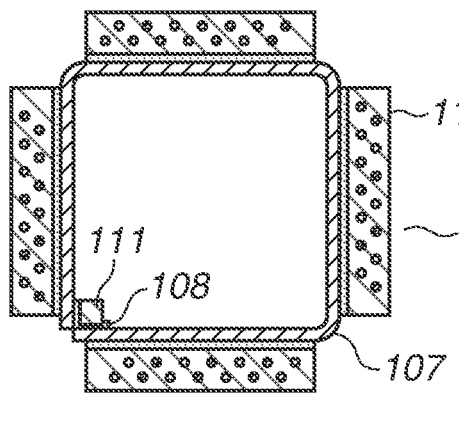
FIG.9B
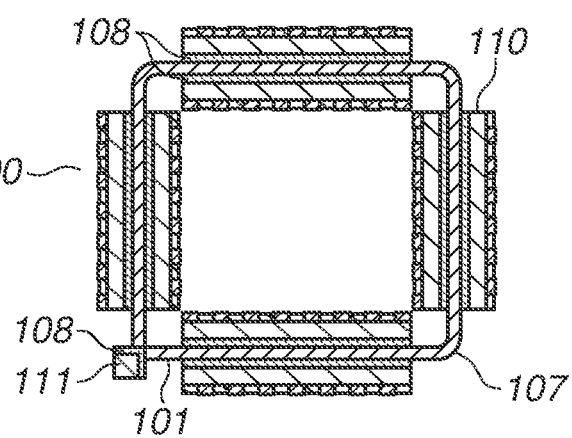
FIG.9C1
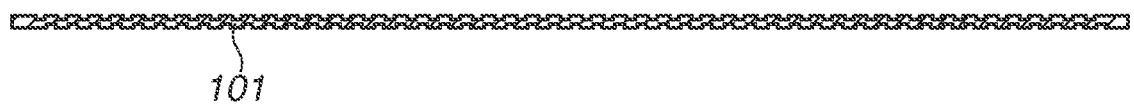
FIG.9C2
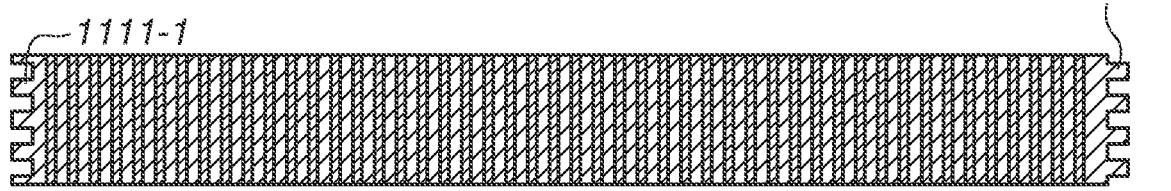

WIRING COMPONENT, MODULE, APPARATUS, AND METHOD FOR MANUFACTURING MODULE

BACKGROUND

Field

Aspects of the present disclosure generally relate to a wiring component.

Description of the Related Art

A wiring component arranged between a plurality of wiring boards and interconnecting the plurality of wiring boards is useful for increasing mounting density.

Japanese Patent Application Laid-Open No. 2001-111232 discusses an electronic-component mounting multi-layer board having a multi-layer structure in which mounting boards are stacked in layers with an interlayer wiring member lying between the mounting boards and the mounting boards are electrically joined to each other by the interlayer wiring member.

Japanese Patent Application Laid-Open No. 2005-183410 discusses a wireless circuit module in which connective double-sided boards are arranged on one surface of a multi-layer board in such a way as to surround four side surfaces of a wireless circuit device.

The technique discussed in Japanese Patent Application Laid-Open No. 2001-111232 has an issue in the general-purpose versatility of the interlayer wiring member and, moreover, has an issue in the reliability of the electronic-component mounting multi-layer board. The technique discussed in Japanese Patent Application Laid-Open No. 2005-183410 has an issue in handling of the connective double-sided board and, moreover, has an issue in the reliability of the wireless circuit module.

SUMMARY

Aspects of the present disclosure are generally directed to increasing the convenience of a wiring component.

According to an aspect of the present disclosure, a wiring component includes a first wiring portion including a plurality of wirings arranged side by side in a first direction, a second wiring portion including a plurality of wirings arranged side by side in a second direction, and a coupling portion configured to couple the first wiring portion and the second wiring portion to each other, wherein an angle formed by the first direction and the second direction is changeable by the coupling portion deforming.

Further features of the present disclosure will become apparent from the following description of exemplary embodiments with reference to the attached drawings.

BRIEF DESCRIPTION OF THE DRAWINGS

FIGS. 3A and 3B are schematic diagrams illustrating a wiring component.

FIGS. 4A, 4B, 4C, 4D, and 4E are schematic diagrams illustrating a method for manufacturing a module.

FIGS. 7A1, 7A2, 7B1, 7B2, 7C1, 7C2, 7D1, 7D2, 7E1, and 7E2 are schematic diagrams illustrating a wiring component and a method for manufacturing the wiring component.

FIGS. 8A1, 8A2, 8B1, 8B2, 8C1, 8C2, 8D1, and 8D2 are schematic diagrams illustrating a wiring component and a method for manufacturing the wiring component.

FIGS. 9A, 9B, 9C1, and 9C2 are schematic diagrams illustrating a wiring component.

DESCRIPTION OF THE EMBODIMENTS

Figure 1A:
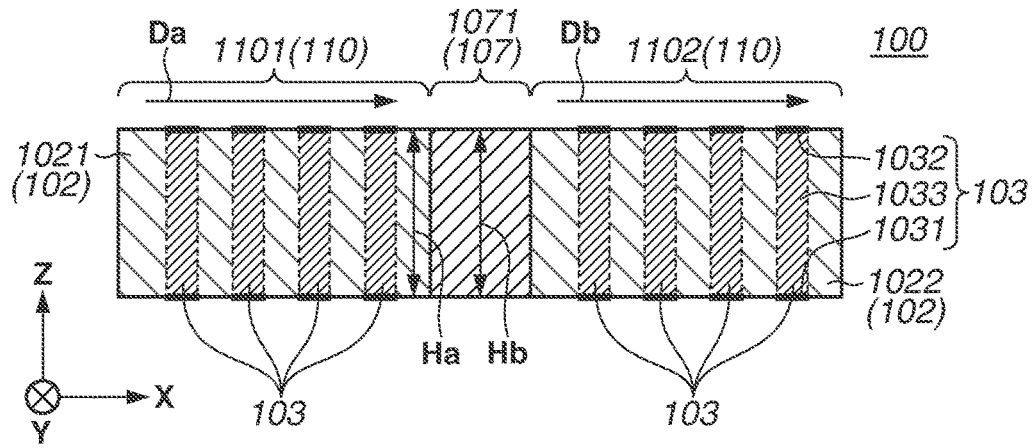
FIGS. 1A, 1B, and 1C are schematic diagrams illustrating a wiring component.

Various exemplary embodiments, features, and aspects of the disclosure will be described in detail below with reference to the drawings. Furthermore, in the following description and figures, constituent elements in common over a plurality of figures are assigned the respective common reference characters. Therefore, constituent elements in common are described by reciprocally referring to a plurality of figures, and constituent elements assigned with the respective common reference characters are omitted from repeated description as appropriate. Furthermore, in each figure, coordinate axes are illustrated as needed.

The X-direction, Y-direction, and Z-direction are directions perpendicular to each other. A direction parallel to a given direction means a direction the angle of which relative to the given direction is 0 degrees or more and 30 degrees or less. An angle formed by two directions is defined only within a range of 0 degrees or more and 90 degrees or less. The angle formed by two directions being 180 degrees is deemed to be the same as the angle formed by two directions being 0 degrees. The angle formed by two directions being 135 degrees is deemed to be the same as the angle formed by two directions being 45 degrees.

A wiring component 100 according to a first exemplary embodiment is described with reference to FIGS. 1A, 1B, and 1C. FIG. 1A is a side view of the wiring component 100, and each of FIGS. 1B and 1C is a top view or bottom view of the wiring component 100.

The wiring component 100 includes a wiring portion 1101, a wiring portion 1102, and a coupling portion 1071. Hereinafter, a plurality of wiring portions 1101 and 1102 provided in one wiring component 100 is collectively referred to as a "wiring portion 110". Moreover, at least one coupling portion 1071 provided in one wiring component 100 is collectively referred to as a "coupling portion 107". The wiring portion 1101 includes a plurality of wirings 103 arranged side by side in a direction Da. The wiring portion 1102 includes a plurality of wirings 103 arranged side by side in a direction Db. In FIGS. 1A and 1B, each of the direction Da and direction Db is illustrated, for example, as a direction parallel to the X-direction. The wiring portion 1101 includes an insulating member 1021, which supports the plurality of wirings 103 of the wiring portion 1101. The wiring portion 1102 includes an insulating member 1022, which supports the plurality of wirings 103 of the wiring portion 1102. The insulating members 1021 and 1022, each of which supports a plurality of wirings 103 in each of a plurality of wiring portions 110 provided in one wiring component 100, are collectively referred to as an "insulating member 102". The coupling portion 1071 couples the wiring portion 1101 and the wiring portion 1102 to each other. The coupling portion 1071 is provided between the wiring portion 1101 and the wiring portion 1102.

Each of the plurality of wirings 103 of the wiring portion 1101 and the plurality of wirings 103 of the wiring portion 1102 includes a pair of terminals (a lower surface terminal 1031 and an upper surface terminal 1032) arranged side by side along the Z-direction, which intersects with the direction Da and direction Db. The wiring 103 includes a path 1033 interconnecting the pair of terminals (the lower surface terminal 1031 and the upper surface terminal 1032). The lower surface terminal 1031 is a portion of the wiring 103 exposed at the lower surface of the wiring portion 110, and the upper surface terminal 1032 is a portion of the wiring 103 exposed at the upper surface of the wiring portion 110. While, in the first exemplary embodiment, the path 1033 is not exposed at any side surface of the wiring portion 110, the path 1033 can be exposed at a side surface of the wiring portion 110.

Figure 1B:
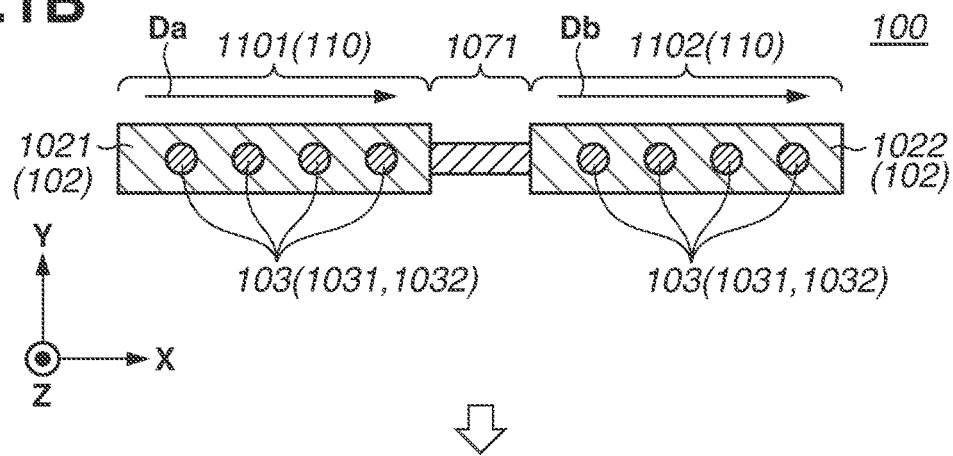
Figure 1C:
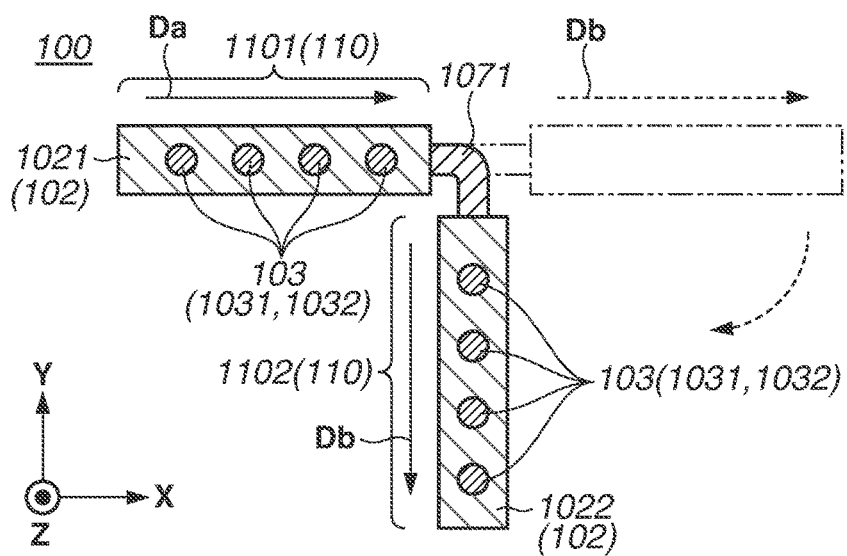

FIG. 1B and FIG. 1C illustrate the wiring component 100 being deformable. Referring to FIG. 1C, the wiring portion 1102 includes a plurality of wirings 103 arranged side by side in a direction Db indicated by a solid arrow. Furthermore, in FIG. 1C, a direction Db indicated by a dashed arrow is a direction Db in FIG. 1B, which is illustrated for purpose of reference. In FIG. 1C, the direction Db indicated by a solid arrow is illustrated, for example, as a direction parallel to the Y-direction. In the wiring component 100 according to the first exemplary embodiment, a direction in which the plurality of wirings 103 of the wiring portion 1101 is arranged side by side and a direction in which the plurality of wirings 103 of the wiring portion 1102 is arranged side by side are changeable by the coupling portion 1071 deforming. The wiring component 100 illustrated in FIG. 1C is bent at the coupling portion 1071. It is favorable that a difference between an angle formed by the direction Da and the direction Db before deformation of the coupling portion 107 and an angle formed by the direction Da and the direction Db after deformation of the coupling portion 107 is 30 degrees or more. It is more favorable that a difference between an angle formed by the direction Da and the direction Db before deformation of the coupling portion 107 and an angle formed by the direction Da and the direction Db after deformation of the coupling portion 107 is 45 degrees or more, and it is further favorable that the difference is 60 degrees or more. In FIG. 1B, an angle formed by the direction Da and the direction Db is, for example, 0 degrees, and, in FIG. 1C, an angle formed by the direction Da and the direction Db is, for example, 90 degrees.

Each of the wiring portion 1101 and the wiring portion 1102 has a structure harder to deform than that of the coupling portion 1071. In other words, the coupling portion 1071 has a structure more easily deformable than each of the wiring portion 1101 and the wiring portion 1102. Although the deformation of the coupling portion 1071 can be elastic deformation, it is favorable that the deformation of the coupling portion 1071 is plastic deformation. In a case where the coupling portion 1071 has a structure hard to deform, if the wiring component 100 is forcedly bent with excessive force, the coupling portion 1071 may be broken down, so that the wiring component 100 fractures and the coupling becomes not maintained. The hardness of the coupling portion 1071 can be set as appropriate in such a manner that the coupling portion 1071 is not broken down under normal use of the wiring component 100.

As compared with a configuration in which the wiring portion 1101 and the wiring portion 1102 are respective individual parts without being coupled to each other, since the wiring portions 110 are coupled to each other at the coupling portion 1071, it is easy to handle the wiring component 100. Moreover, as compared with a configuration in which the wiring portion 1101 and the wiring portion 1102 are fixed in a rigid manner, since the coupling portion 1071 is deformable, the wiring portion 1101 and the wiring portion 1102 are able to be located as desired by the user, so that general-purpose versatility is increased. In this way, providing the deformable coupling portion 1071 enables increasing the convenience of the wiring component 100.

Figure 2A:
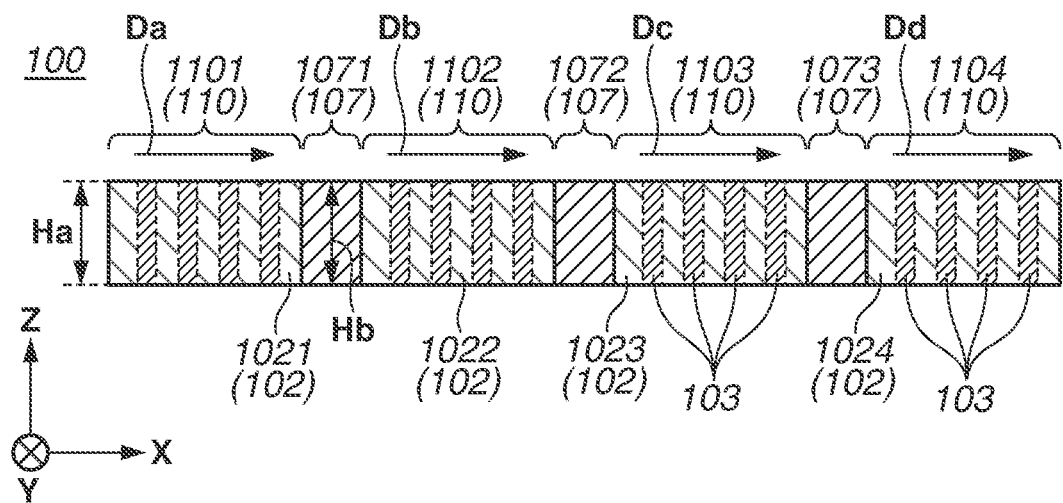
FIGS. 2A, 2B, and 2C are schematic diagrams illustrating a wiring component.
Figure 2B:
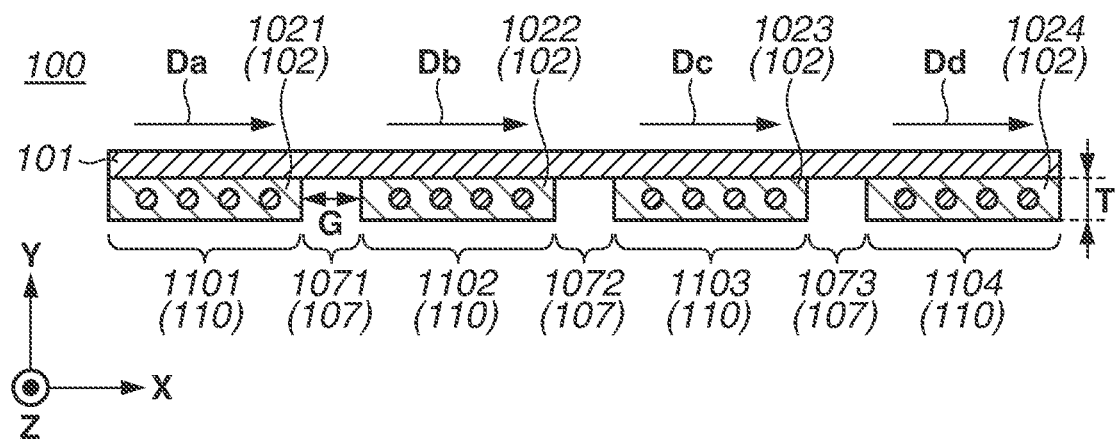
Figure 2C:
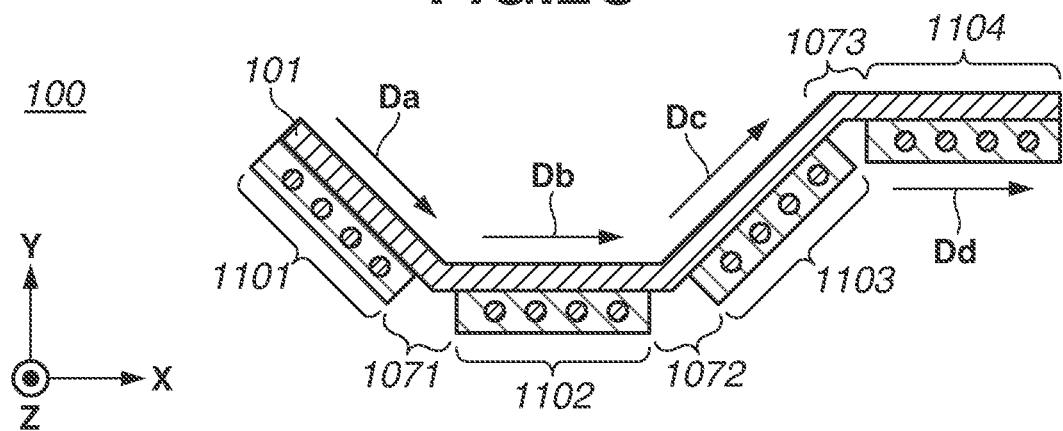

A wiring component 100 according to a second exemplary embodiment is described with reference to FIGS. 2A, 2B, and 2C. In the second exemplary embodiment, the particulars in common to those in the first exemplary embodiment are omitted from description. FIG. 2A is a side view of the wiring component 100, and each of FIGS. 2B and 2C is a top view or bottom view of the wiring component 100.

The wiring component 100 further includes a wiring portion 1103 and a coupling portion 1072. The wiring portion 1103 includes a plurality of wirings 103 arranged side by side in a direction Dc. In FIGS. 2A and 2B, the direction Dc is illustrated, for example, as a direction parallel to the X-direction. The wiring portion 1103 includes an insulating member 1023, which supports the plurality of wirings 103 of the wiring portion 1103. The coupling portion 1072 couples the wiring portion 1102 and the wiring portion 1103 to each other. The coupling portion 1072 is provided between the wiring portion 1102 and the wiring portion 1103.

The wiring component 100 further includes a wiring portion 1104 and a coupling portion 1073. The wiring portion 1104 includes a plurality of wirings 103 arranged side by side in a direction Dd. In FIGS. 2A and 2B, the direction Dd is illustrated, for example, as a direction parallel to the X-direction. The wiring portion 1104 includes an insulating member 1024, which supports the plurality of wirings 103 of the wiring portion 1104.

The coupling portion 1073 couples the wiring portion 1103 and the wiring portion 1104 to each other. The coupling portion 1073 is provided between the wiring portion 1103 and the wiring portion 1104.

Hereinafter, a plurality of coupling portions 1071, 1072, and 1073 provided in one wiring component 100 is collectively referred to as a "coupling portion 107". The number of coupling portions 107 provided in one wiring component 100 can be four or more.

Each of the plurality of wirings 103 of the wiring portion 1103 and the plurality of wirings 103 of the wiring portion 1104 includes a pair of terminals (a lower surface terminal 1031 and an upper surface terminal 1032) arranged side by side along the Z-direction, which intersects with the direction Da, direction Db, direction Dc, and direction Dd.

The dimension of the coupling portion 1071 in the Z-direction, which intersects with the directions Da and Db in which the wirings 103 are arranged side by side, is assumed to be a height Hb. The dimension of a wiring 103 in the wiring portion 110 (the wiring portion 1101 and the wiring portion 1102) in the Z-direction, which intersects with the directions Da and Db in which the wirings 103 are arranged side by side, is assumed to be a height Ha. The wiring 103 about which the height Ha is defined is one wiring of the plurality of wirings 103, and it is favorable that all of the wirings 103 of the plurality of wirings 103 have the same height Ha. The height Ha is a distance between the external surface of the lower surface terminal 1031 and the external surface of the upper surface terminal 1032 of one wiring 103. The height Hb is a distance between the lower surface and the upper surface of the coupling portion 1071. The height Hb can be larger than or equal to the height Ha (Hb≥Ha). In the second exemplary embodiment, the dimension (height Hb) of the coupling portion 107 (the coupling portion 1071) in the Z-direction, which intersects with the direction in which the wirings 103 are arranged side by side, is equal to the dimension (height Ha) of the wiring 103 in the wiring portion 110 (the wiring portion 1101 and the wiring portion 1102) in the Z-direction, which intersects with the direction in which the wirings 103 are arranged side by side (Ha=Hb).

Typically, the lower surface or the upper surface of the insulating member 102 and the external surface of the lower surface terminal 1031 or the upper surface terminal 1032 can exist on the same plane. In that case, the height Ha can become equal to the dimension (height Ha') of the insulating member 102 (the insulating members 1021, 1022, 1023, and 1024) in the Z-direction, which intersects with the directions Da and Db in which the wirings 103 are arranged side by side (Ha=Ha'). However, the height Ha of the wiring 103 can be different from the height Ha' of the insulating member 102. Thus, if the lower surface terminal 1031 or the upper surface terminal 1032 recedes (is recessed) from the lower surface or the upper surface of the insulating member 102, the height Ha of the wiring 103 can become smaller than the height Ha' of the insulating member 102 (Ha<Ha'). If the lower surface terminal 1031 or the upper surface terminal 1032 protrudes (is raised) from the lower surface or the upper surface of the insulating member 102, the height Ha of the wiring 103 can become larger than the height Ha' of the insulating member 102 (Ha>Ha'). The height Hb can be larger than or equal to the dimension (height Ha') of the insulating member 102 (the insulating members 1021, 1022, 1023, and 1024) in the Z-direction, which intersects with the directions Da and Db in which the wirings 103 are arranged side by side. Thus, the height Hb of the coupling portion 1071 can be larger than or equal to the height Ha' of the insulating member 102.

Moreover, it is favorable that a distance (interval G) between the wiring portion 1101 and the wiring portion 1102 is smaller than the dimension (thickness T) of the wiring portion 110 (the wiring portions 1101 and 1102) in the Y-direction, which is perpendicular to the directions Da and Db in which the wirings 103 are arranged side by side. Moreover, it is favorable that a distance (interval G) between the wiring portion 1101 and the wiring portion 1102 is smaller than the dimension (thickness T) of the wiring portion 110 (the wiring portions 1101 and 1102) in the Y-direction, which is perpendicular to the Z-direction which intersects with the directions Da and Db in which the wirings 103 are arranged side by side.

FIG. 2B and FIG. 2C illustrate the wiring component 100 being deformable. Referring to FIG. 2C, the wiring portion 1103 includes a plurality of wirings 103 arranged side by side in the direction Dc. In FIG. 2C, the direction Dc is illustrated, for example, as a direction oblique to the X-direction and the Y-direction. In the wiring component 100 according to the second exemplary embodiment, the direction Db, in which the plurality of wirings 103 of the wiring portion 1102 is arranged side by side, and the direction Dc, in which the plurality of wirings 103 of the wiring portion 1103 is arranged side by side, are changeable by the coupling portion 1072 deforming. Moreover, in the wiring component 100 according to the second exemplary embodiment, the direction Dc, in which the plurality of wirings 103 of the wiring portion 1103 is arranged side by side, and the direction Dd, in which the plurality of wirings 103 of the wiring portion 1104 is arranged side by side, are changeable by the coupling portion 1073 deforming. In FIG. 2B, an angle formed by the direction Db and the direction Dc is, for example, 0 degrees, and, in FIG. 2C, an angle formed by the direction Db and the direction Dc is, for example, 45 degrees. In FIG. 2B, an angle formed by the direction Dc and the direction Dd is, for example, 0 degrees, and, in FIG. 2C, an angle formed by the direction Dc and the direction Dd is, for example, 45 degrees. The second exemplary embodiment is not limited to the example illustrated in FIG. 2C, and the direction in which the wirings 103 of the wiring portion 110 are arranged side by side can be optionally set in the range of 0 degrees to 90 degrees.

The wiring component 100 according to the second exemplary embodiment further includes a base substrate 101 provided over the wiring portion 1101 and the wiring portion 1102. The base substrate 101 is further provided over the wiring portion 1103 and the wiring portion 1104. A plurality of wiring portions 110 (the wiring portions 1101, 1102, 1103, and 1104) includes the base substrate 101. A plurality of coupling portions 107 (the coupling portions 1071, 1072, and 1073) also includes the base substrate 101. The deformation of the coupling portion 107 is caused by the deformation of the base substrate 101.

Although the deformation of the base substrate 101 can be elastic deformation, it is favorable that the deformation of the base substrate 101 is plastic deformation. Each of the wiring portion 1102 and the wiring portion 1103 has a structure harder to deform than that of the coupling portion 1072. Moreover, each of the wiring portion 1103 and the wiring portion 1104 has a structure harder to deform than that of the coupling portion 1073. In other words, each of the coupling portions 1071, 1072, and 1073 has a structure more easily deformable than each of the wiring portions 1101, 1102, 1103, and 1104.

It is favorable that the base substrate 101 has a structure harder to deform than that of the insulating member 102. For example, a rigid substrate can be used for the insulating member 102, and a flexible substrate can be used for the base substrate 101. The coupling portion 107 can be configured to differ in the easiness of deformation between before deformation and after deformation. For example, a configuration in which, before the coupling portion 107 is bent, the coupling portion 107 is easily deformable and, after the coupling portion 107 is bent, the coupling portion 107 is hard to deform can be employed.

A thermosetting resin can be used for the base substrate 101, and a configuration in which, before being thermally hardened, the base substrate 101 is easily plastically deformable and, after being thermally hardened, the base substrate 101 becomes hard to plastically deform (is elastically deformable) can be employed. A thermoplastic resin can be used for the base substrate 101, and a configuration in which, when the base substrate 101 is heated, the base substrate 101 softens and becomes easily plastically deformable and, when the base substrate 101 is cooled, the base substrate 101 hardens and becomes hard to plastically deform (is elastically deformable) can be employed.

The coupling portion 107 can be configured only with an insulator, but can also be configured only with an electrical conductor. A metallic plate or metallic tape can be used as the base substrate 101. A shape-memory alloy can be used for the base substrate 101, and a shape thereof can be kept stored in such a manner that, when being at a given temperature, the base substrate 101 takes a given posture (for example, a linear posture) and, when being at another temperature, the base substrate 101 takes another posture (for example, a curved posture). The coupling portion 107 can also be configured with a composite member composed of an insulator and an electrical conductor.

For example, a member obtained by forming an electrical conductor film on an insulator substrate can be used as the base substrate 101.

The wiring portion 1101 includes an insulating member 1021, which supports a plurality of wirings 103 of the wiring portion 1101, and the insulating member 1021 is bonded to the base substrate 101 via an adhesive. The wiring portion 1102 includes an insulating member 1022, which supports a plurality of wirings 103 of the wiring portion 1102, and the insulating member 1022 is bonded to the base substrate 101 via an adhesive. In this way, in the wiring portion 110, a plurality of insulating members 102 (the insulating members 1021, 1022, 1023, and 1024) which supports a plurality of wirings 103 of the wiring portion 110 can be bonded to the base substrate 101 via an adhesive. Furthermore, the adhesive is a member used for bonding two members to each other by adhesion and can be a two-sided adhesive tape or a member resulting from a liquid adhesive hardening (becoming solidified).

A wiring component 100 according to a third exemplary embodiment is described with reference to FIGS. 3A and 3B. In the third exemplary embodiment, the particulars in common to those in the first and second exemplary embodiments are omitted from description. FIG. 3A is a side view of the wiring component 100, and FIG. 3B is a top view or bottom view of the wiring component 100.

In the third exemplary embodiment, a wiring portion 1101 includes a first group of wirings 103 and a fifth group of wirings 103. A base substrate 101 is located between the first group of wirings 103 and the fifth group of wirings 103.

The wiring portion 1101 further includes an insulating member 1021, which supports the first group of wirings 103, and an insulating member 1026, which supports the fifth group of wirings 103. The base substrate 101 is located between the insulating member 1021 and the insulating member 1026.

A wiring portion 1102 includes a second group of wirings 103 and a sixth group of wirings 103. The base substrate 101 is located between the second group of wirings 103 and the sixth group of wirings 103. The wiring portion 1102 further includes an insulating member 1022, which supports the second group of wirings 103, and an insulating member 1027, which supports the sixth group of wirings 103. The base substrate 101 is located between the insulating member 1022 and the insulating member 1027. A wiring portion 1103 includes a third group of wirings 103 and a seventh group of wirings 103. The base substrate 101 is located between the third group of wirings 103 and the seventh group of wirings 103. The wiring portion 1103 further includes an insulating member 1023, which supports the third group of wirings 103, and an insulating member 1028, which supports the seventh group of wirings 103. The base substrate 101 is located between the insulating member 1023 and the insulating member 1028. A wiring portion 1104 includes a fourth group of wirings 103 and an eighth group of wirings 103. The base substrate 101 is located between the fourth group of wirings 103 and the eighth group of wirings 103. The wiring portion 1104 further includes an insulating member 1024, which supports the fourth group of wirings 103, and an insulating member 1029, which supports the eighth group of wirings 103. The base substrate 101 is located between the insulating member 1024 and the insulating member 1029.

In this way, arranging the wirings 103 on both sides of the base substrate 101 enables increasing the number of wirings. Moreover, while, in the third exemplary embodiment, the path 1033 is exposed at the side surface of the wiring portion 110, the path 1033 does not need to be exposed at the side surface of the wiring portion 110.

A method for manufacturing a module using a wiring component 100 according to a fourth exemplary embodiment is described with reference to FIGS. 4A, 4B, 4C, 4D, and 4E. In each of FIGS. 4A to 4E, the left-hand portion thereof is a sectional view and the right-hand portion thereof is a plan view.

In a process Sa illustrated in FIG. 4A, the method prepares a wiring board 1002 including electrodes 220. The method arranges a solder paste 211 on the electrodes 220. Moreover, the method arranges an electronic component 106 on the wiring board 1002. At the stage of the process Sa, the electronic component 106 can already have been fixed to the wiring board 1002, or, at the stage of the process Sa, a solder paste not yet heated can be previously provided between the electronic component 106 and the wiring board 1002.

In a process Sb illustrated in FIG. 4B, the method prepares a wiring component 100 described in the first to third exemplary embodiments (in the fourth exemplary embodiment, a wiring component 100 described in the second exemplary embodiment). The wiring component 100 includes a base substrate 101, which configures coupling portions 1071, 1072, and 1073. The base substrate 101 includes a portion included in a wiring portion 1101, a portion included in a wiring portion 1102, a portion included in a wiring portion 1103, and a portion included in a wiring portion 1104.

The method deforms the wiring component 100 into an appropriate shape. In the wiring component 100 obtained before being deformed, an angle formed by a direction in which wirings 103 of the wiring portion 1101 are arranged side by side and a direction in which wirings 103 of the wiring portion 1102 are arranged side by side is assumed to be θa. In the wiring component 100 obtained after being deformed, an angle formed by a direction in which wirings 103 of the wiring portion 1101 are arranged side by side and a direction in which wirings 103 of the wiring portion 1102 are arranged side by side is assumed to be θb. Typically, the angle θb is larger than the angle θa. For example, the wiring component 100 obtained before being deformed is in a state in which a plurality of wiring portions 110 is arranged in a line or is folded back, so that the angle θa is smaller than 45 degrees and is, for example, 0 degrees. On the other hand, the wiring component 100 obtained after being deformed is in a state in which the wiring component 100 having been straight is bent or the wiring component 100 having been folded back is bent, so that the angle θb is larger than or equal to 45 degrees and is, for example, 90 degrees.

Similarly, in the wiring component 100 obtained before being deformed, an angle formed by a direction in which wirings 103 of the wiring portion 1102 are arranged side by side and a direction in which wirings 103 of the wiring portion 1103 are arranged side by side is assumed to be θc. In the wiring component 100 obtained after being deformed, an angle formed by a direction in which wirings 103 of the wiring portion 1102 are arranged side by side and a direction in which wirings 103 of the wiring portion 1103 are arranged side by side is assumed to be θd. Typically, the angle θd is larger than the angle θc. Moreover, in the wiring component 100 obtained before being deformed, an angle formed by a direction in which wirings 103 of the wiring portion 1103 are arranged side by side and a direction in which wirings 103 of the wiring portion 1104 are arranged side by side is assumed to be θe. In the wiring component 100 obtained after being deformed, an angle formed by a direction in which wirings 103 of the wiring portion 1103 are arranged side by side and a direction in which wirings 103 of the wiring portion 1104 are arranged side by side is assumed to be θf. Typically, the angle θf is larger than the angle θe. Moreover, in the wiring component 100 obtained before being deformed, an angle formed by a direction in which wirings 103 of the wiring portion 1104 are arranged side by side and a direction in which wirings 103 of the wiring portion 1101 are arranged side by side is assumed to be θg. In the wiring component 100 obtained after being deformed, an angle formed by a direction in which wirings 103 of the wiring portion 1104 are arranged side by side and a direction in which wirings 103 of the wiring portion 1101 are arranged side by side is assumed to be θh. Typically, the angle θh is larger than the angle θg.

In the fourth exemplary embodiment, as a modification example, a portion of the base substrate 101 included in the wiring portion 1101 and a portion of the base substrate 101 included in the wiring portion 1103 can be located between a plurality of wirings 103 included in the wiring portion 1101 and a plurality of wirings 103 included in the wiring portion 1103. Moreover, a portion of the base substrate 101 included in the wiring portion 1102 and a portion of the base substrate 101 included in the wiring portion 1104 can be located between a plurality of wirings 103 included in the wiring portion 1102 and a plurality of wirings 103 included in the wiring portion 1104. Thus, the wiring component 100 is deformed in such a manner that a plurality of wirings 103 surrounds the base substrate 101.

As another modification example, a plurality of wirings 103 included in the wiring portion 1101 and a plurality of wirings 103 included in the wiring portion 1103 can be located between a portion of the base substrate 101 included in the wiring portion 1101 and a portion of the base substrate 101 included in the wiring portion 1103. Moreover, a plurality of wirings 103 included in the wiring portion 1102 and a plurality of wirings 103 included in the wiring portion 1104 can be located between a portion of the base substrate 101 included in the wiring portion 1102 and a portion of the base substrate 101 included in the wiring portion 1104. Thus, the wiring component 100 is deformed in such a manner that the base substrate 101 surrounds a plurality of wirings 103.

In a case where, as in the second exemplary embodiment, the wirings 103 are located on only one surface of the base substrate 101, if a plurality of wirings 103 is arranged in such a way as to surround the base substrate 101, a greater number of wirings 103 are able to be arranged than in a case where the base substrate 101 is arranged in such a way as to surround a plurality of wirings 103. This is because, if the wiring component 100 is bent with the wirings 103 set at the inner side of the base substrate 101, an interval between the wiring portions 110 narrows and, if the wiring component 100 is bent with the wirings 103 set at the outer side of the base substrate 101, an interval between the wiring portions 110 widens. Therefore, the influence of a mechanical interference between adjacent wiring portions 110 is smaller in a case where the wiring component 100 is bent with the wirings 103 set at the outer side of the base substrate 101 than in a case where the wiring component 100 is bent with the wirings 103 set at the inner side of the base substrate 101. To bend the wiring component 100 with the wirings 103 set at the inner side of the base substrate 101, it is appropriate that the length of the coupling portion 107 is two times or more the thickness T of the wiring portion 110. However, if the wiring component 100 is bent with the wirings 103 set at the outer side of the base substrate 101, it is also possible to make the interval G between wiring portions 110 less than or equal to one time the thickness T of the wiring portion 110. If the interval G between wiring portions 110 is made smaller and the length of the wiring portion 110 is made larger, it is possible to increase the number of wirings 103.

It is favorable that the interval G between wiring portions 110 (for example, a distance between the wiring portion 1101 and the wiring portion 1102) is smaller than the dimension (thickness T) of the wiring portion 110 (the wiring portion 1101 or 1102) in a direction (Y-direction) perpendicular to the directions Da and Db, in which the wirings 103 are arranged side by side. It is favorable that the interval G between wiring portions 110 (for example, a distance between the wiring portion 1101 and the wiring portion 1102) is smaller than the dimension (thickness T) of the wiring portion 110 (the wiring portion 1101 or 1102) in a direction (Y-direction) perpendicular to the Z-direction, in which the wirings 103 extend.

If, as in the third exemplary embodiment, the wirings 103 are located on both surfaces of the base substrate 101, a plurality of wirings 103 located on the outer side surrounds the base substrate 101 and the base substrate 101 surrounds a plurality of wirings 103 located on the inner side. In the third exemplary embodiment, an interval g between the insulating members 1026, 1027, 1028, and 1029 is larger than an interval G between the insulating members 1021, 1022, 1023, and 1024. It is favorable that the wiring component 100 is arranged in such a manner that the insulating members 1026, 1027, 1028, and 1029 surround the base substrate 101 and the base substrate 101 surrounds the insulating members 1021, 1022, 1023, and 1024. This is because, in the outer side, in which the influence of a mechanical interference between adjacent wiring portions 110 is small, it is possible to make the interval g between wiring portions 110 smaller and make the length of the wiring portion 110 larger.

The method arranges the wiring component 100, which has been deformed in the above-mentioned way, on the wiring board 1002. The method performs position adjustment between the wiring component 100 and the wiring board 1002. The position adjustment is performed, for example, in such a manner that the lower surface terminal 1031 and the electrode 220 face each other.

In a process Sc illustrated in FIG. 4C, the method arranges the wiring component 100 on the wiring board 1002. Then, the method connects one of a pair of terminals (the lower surface terminal 1031) of the wiring component 100 to the electrode 220 of the wiring board 1002. For example, the lower surface terminal 1031 of the wiring component 100 and the electrode 220 of the wiring board 1002 are electrically connected to each other by a conductive member 210 (solder) obtained from the solder paste 211 by melting the solder paste 211 with a reflow furnace and then cooling the solder paste 211.

In a process Sd illustrated in FIG. 4D, the method prepares a wiring board 1001 including electrodes 222. The method arranges a solder paste 212 on the electrodes 222. Moreover, the method arranges an electronic component 240 on the wiring board 1001. At the stage of the process Sd, the electronic component 240 can have already been fixed to the wiring board 1001, or, at the stage of the process Sd, a solder paste not yet heated can be previously provided between the electronic component 240 and the wiring board 1001.

Additionally, in the process Sd, the method arranges the wiring component 100, the wiring board 1002, and the wiring board 1001 in such a manner that the wiring component 100 is located between the wiring board 1002 and the wiring board 1001. Then, the method performs position adjustment between the wiring component 100 and the wiring board 1001. The position adjustment is performed, for example, in such a manner that the upper surface terminal 1032 and the electrode 222 face each other.

In a process Se illustrated in FIG. 4E, the method connects the other of a pair of terminals (the upper surface terminal 1032) of the wiring component 100 to the electrode 222 of the wiring board 1001. For example, the upper surface terminal 1032 of the wiring component 100 and the electrode 222 of the wiring board 1001 are electrically connected to each other by a conductive member 213 (solder) obtained from the solder paste 212 by melting the solder paste 212 with a reflow furnace and then cooling the solder paste 212.

The electronic component 106 is previously mounted on the wiring board 1002 at any of the stages. Before the wiring board 1002 and the wiring component 100 are fixed to each other in the process Sc, the wiring board 1002 and the electronic component 106 can be fixed to each other. Alternatively, at the same time that the wiring board 1002 and the wiring component 100 are fixed to each other in the process Sc, the wiring board 1002 and the electronic component 106 can be fixed to each other. In this case, printing or reflow of a solder paste for fixing the wiring component 100 to the wiring board 1002 can be performed at the same time as printing or reflow of a solder paste for fixing the electronic component 106 to the wiring board 1002. While, after the wiring board 1002 and the wiring component 100 are fixed to each other in the process Sc, the wiring board 1002 and the electronic component 106 can be fixed to each other, the wiring component 100 may hinder the electronic component 106 being arranged. In the fourth exemplary embodiment, the electronic component 106 is mounted on the same side as the wiring component 100 (the side facing the wiring board 1001) with respect to the wiring board 1002. If the electronic component 106 is mounted on the side opposite to the wiring component 100 with respect to the wiring board 1002, the wiring component 100 is unlikely to hinder the electronic component 106 being arranged. Electronic components 106 can be mounted on both surfaces of the wiring board 1002.

The electronic component 240 is previously mounted on the wiring board 1001 at any of the stages. Before the wiring board 1001 and the wiring component 100 are fixed to each other in the process Se, the wiring board 1001 and the electronic component 240 can be fixed to each other. Alternatively, at the same time that the wiring board 1001 and the wiring component 100 are fixed to each other in the process Se, the wiring board 1001 and the electronic component 240 can be fixed to each other. In this case, printing or reflow of a solder paste for fixing the wiring component 100 to the wiring board 1001 can be performed at the same time as printing or reflow of a solder paste for fixing the electronic component 240 to the wiring board 1001. While, after the wiring board 1001 and the wiring component 100 are fixed to each other in the process Se, the wiring board 1001 and the electronic component 240 can be fixed to each other, the wiring component 100 may hinder the electronic component 240 being arranged.

In the fourth exemplary embodiment, the electronic component 240 is mounted on the same side as the wiring component 100 (the side facing the wiring board 1002) with respect to the wiring board 1001. If the electronic component 240 is mounted on the side opposite to the wiring component 100 with respect to the wiring board 1001, the wiring component 100 is unlikely to hinder the electronic component 240 being arranged. Thus, the electronic component 240 can be mounted on the wiring board 1001 in such a manner that the wiring board 1001 is located between the wiring board 1002 and the electronic component 240. Electronic components can be mounted on both surfaces of the wiring board 1001.

The electronic component 106 and the electronic component 240 can be electrically connected to each other via the wiring component 100. One of the electronic component 106 and the electronic component 240 can be configured to output or supply a signal or electric power to the other of the electronic component 106 and the electronic component 240 via the wiring component 100.

The dimension (height Hb) of the base substrate 101 (the coupling portion 107) in the Z-direction, which intersects with the directions Da and Db in which the wirings 103 are arranged side by side, can be larger than or equal to the dimension (height Ha) of the wiring 103 of the wiring portion 110 (the wiring portion 1101 and the wiring portion 1102) in the Z-direction, which intersects with the directions Da and Db in which the wirings 103 are arranged side by side. This enables decreasing an interval between the base substrate 101 (the coupling portion 107) and the wiring board 1001 or an interval between the base substrate 101 (the coupling portion 107) and the wiring board 1002.

The module 300 manufactured in the above-described way includes the wiring board 1002, the wiring board 1001, which overlaps the wiring board 1002, and the wiring component 100. The wiring component 100 is arranged between the wiring board 1002 and the wiring board 1001. One (the lower surface terminal 1031) of a pair of terminals (the lower surface terminal 1031 and the upper surface terminal 1032) of the wiring component 100 is connected to the electrode 220 of the wiring board 1002. The other (the upper surface terminal 1032) of a pair of terminals (the lower surface terminal 1031 and the upper surface terminal 1032) of the wiring component 100 is connected to the electrode 222 of the wiring board 1001.

In such a module 300, since the coupling portion 107 is provided between the wiring portions 110, it is possible to prevent or reduce any foreign substance from entering a space between the wiring board 1002 and the wiring board 1001 (a space surrounded by the wiring component 100). Moreover, since the coupling portion 107 is deformable, it is possible to absorb stress that may occur due to the thermal expansion of the wiring board 1001 or 1002. For these reasons, it is possible to increase the reliability of the module 300. Moreover, since an electrical conductor is used for at least a part of the coupling portion 107, the coupling portion 107 is able to function as an electromagnetic shield for an electronic component located between the wiring board 1001 and the wiring board 1002.

Such a module 300 can be mounted on various apparatuses. Each apparatus can include a module and a casing, which houses the module. Since the wiring board 1001 and the wiring board 1002 are able to be densely mounted inside a casing with a limited size, it is possible to increase the performance of the apparatus and implement a reduction in size of the apparatus. The apparatus to which the fourth exemplary embodiment is applied can be an electronic apparatus, such as a camera, a smartphone, a tablet, or a personal computer. Moreover, the apparatus to which the fourth exemplary embodiment is applied can be a business machine, such as a copying machine or a printer. Moreover, the apparatus to which the fourth exemplary embodiment is applied can be medical equipment, such as a computer tomography (CT) scanner, an X-ray apparatus, or an endoscope. Moreover, the apparatus to which the fourth exemplary embodiment is applied can be industrial equipment, such as a robot or a semiconductor manufacturing apparatus.

An imaging apparatus, such as a digital camera or a smartphone with a built-in camera, which is an example of an electronic apparatus, includes a circuit board or an imaging module in which an electronic component such as an image sensor is mounted on a wiring board. Along with a reduction in size, an increase in high image quality, and an increase in performance of the imaging apparatus, the electronic component has also decreased in size and increased in performance. With regard to the imaging module, more high-density mounting of a relatively large semiconductor component with a certain height (thickness), such as an electronic component, and a large number of electronic components to a wiring board is progressing. On the other hand, with regard to the imaging apparatus, along with an increase in high-definition, an increase in size, such as Advanced Photo System type-C (APS-C) size or full-frame size, is also progressing.

Along with this, with regard to the wiring board, a high-density mounting structure of an electronic component is also being requested. As an example of the high-density mounting structure, there is known a laminated circuit board in which wiring boards on each of which a semiconductor device or an electronic component is mounted are stacked in multiple layers and electrically connected to each other.

As one of methods of electrically connection of the laminated circuit board, there is a method of, for example, connection using a solder ball or connection using a wiring component having wirings and a solder.

In the future, with regard to lamination of wiring boards, a wiring component with a certain height and with more high-density and narrow-pitch wirings is expected. Moreover, a wiring component easy to precisely assemble to a wiring board is being requested.

However, it is becoming difficult to hold by itself and precisely arrange an insulating substrate with a certain height cut into a long quadrangle. Moreover, since an integrated frame-like wiring component is easy to assemble but is formed from a substrate larger than the outer shape of the integrated frame, a substrate located inside the frame is to be discarded, so that an environmental load tends to become large.

According to the fourth exemplary embodiment, a wiring component, which has high-density and narrow-pitch wirings and has a certain height and which is able to be easily manufactured with a little environmental load, and a method for manufacturing the wiring component can be provided.

Figure 5A:
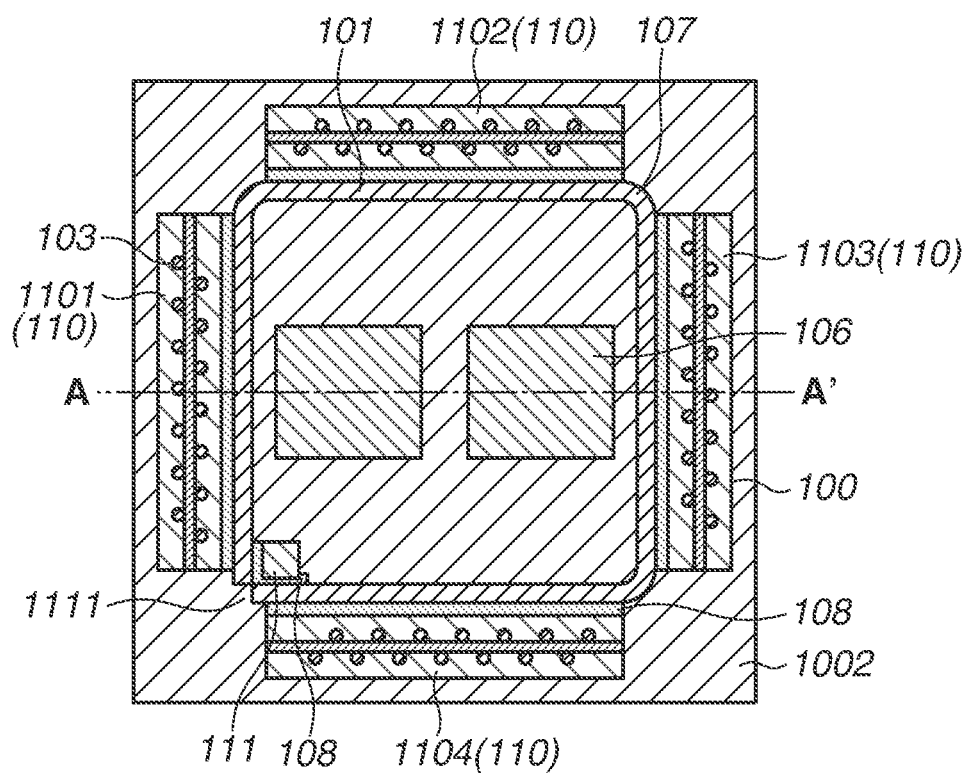
FIGS. 5A and 5B are schematic diagrams illustrating a module.
Figure 5B:
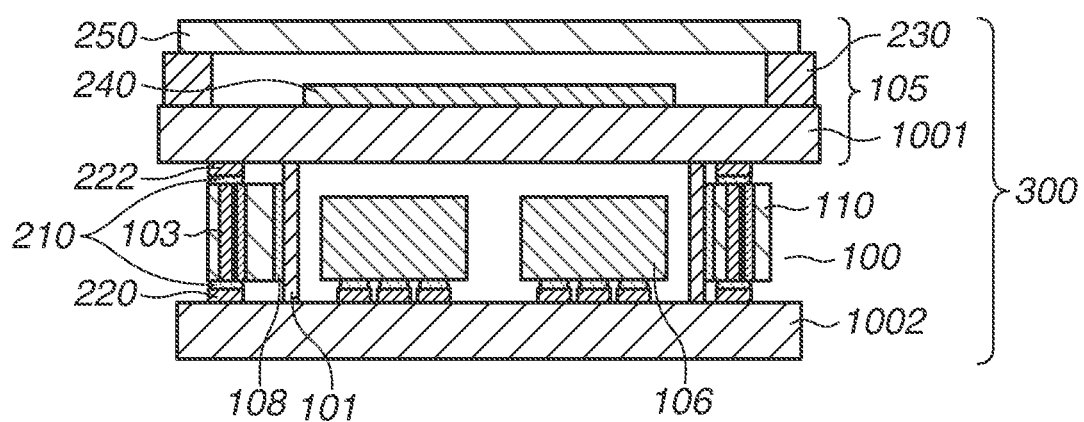

FIGS. 5A and 5B are schematic diagrams of an imaging module, which is an example of a module 300 using a wiring component 100 according to a fifth exemplary embodiment, in which FIG. 5A is a projection view as viewed from the top surface in a transmissive manner and FIG. 5B is a sectional view taken along line A-A' in FIG. 5A.

The module 300 includes a unit 105, in which an image sensor (imaging element) 240, a frame member 230, and a lid member 250 are mounted on a wiring board 1001, a wiring board 1002, on which a component with a certain height, such as an electronic component 106, is mounted, and a wiring component 100.

The wiring component 100 is formed by bonding a wiring portion 1101 to a base substrate 101 having a bendable coupling portion 107 with an adhesive 108. Four wiring portions 1101 are arranged in such a way as to surround two electronic components 106. Here, the electronic component 106 is a memory, such as a dynamic random access memory (DRAM) or a flash memory, but can be, for example, a power integrated circuit (IC), a digital signal processor (DSP), or a controller.

The electrode 222 of the wiring board 1001, the electrode 220 of the wiring board 1002, and the wiring 103 of the wiring portion 1101 of the wiring component 100 are electrically and mechanically connected to each other via a solder 210.

Each of the electrodes 220 and 222 is an electrode formed from a metal having electrical conductivity, such as copper, and is, for example, a signal electrode, a power electrode, a ground electrode, or a dummy electrode. Each of the wiring board 1001 and the wiring board 1002 is a rigid board formed from an insulating material, such as a glass fiber-containing epoxy resin, but can be a flexible board. While each of the wiring board 1001 and the wiring board 1002 can be a printed wiring board, the method of forming wirings on each of the wiring board 1001 and the wiring board 1002 is not limited to printing but can be photolithography. Moreover, each of the wiring board 1001 and the wiring board 1002 can be a ceramic board or a glass board.

Figure 6A:
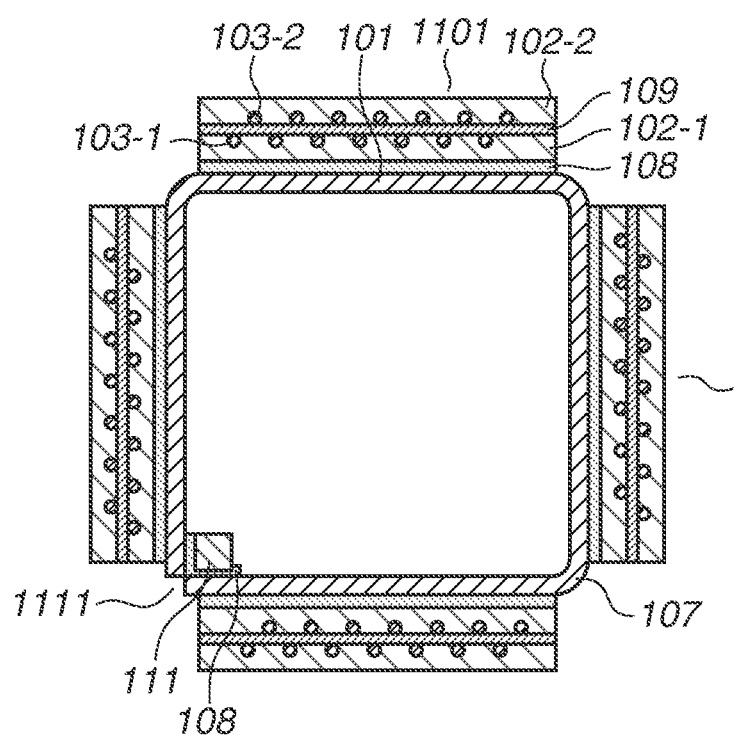
FIGS. 6A, 6B, and 6C are schematic diagrams illustrating a wiring component.
Figure 6C:
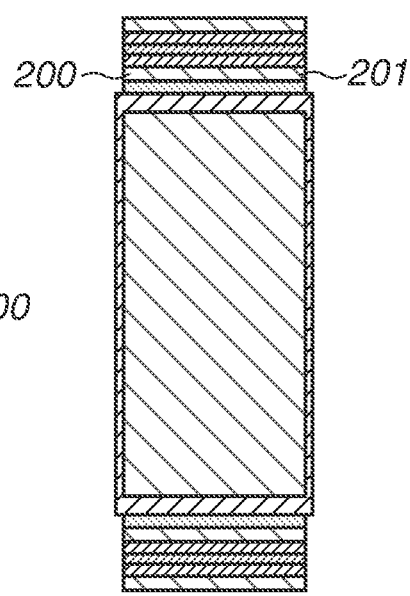
Figure 6B:
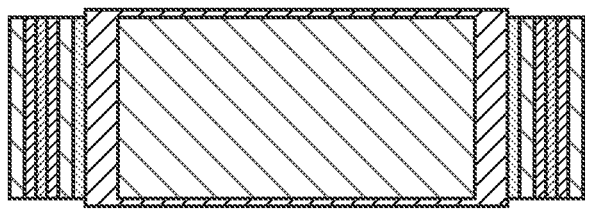

FIGS. 6A, 6B, and 6C are schematic diagrams of a wiring component according to the fifth exemplary embodiment, in which FIG. 6A is a top view of an example of a structure of the wiring component, FIG. 6B is a front view of the wiring component illustrated in FIG. 6A, and FIG. 6C is a side view of the wiring component illustrated in FIG. 6A.

The wiring component 100 is formed by bonding a wiring portion 1101 to a base substrate 101 having a bendable coupling portion 107 with an adhesive 108. A base substrate 101 of the wiring component 100 is fixed at a base substrate terminal end 1111 with use of a corner connection member 111 and an adhesive 108 or with use of, for example, a fitting method.

The base substrate 101 can be an electrically conducting material, such as metal, or an insulating material, such as Teflon® or polyimide. The bendable coupling portion 107 can be the same material as the base substrate 101 and have the same shape as the base substrate 101, as long as it is bendable. Moreover, the bendable coupling portion 107 is a portion processed in such a way as to be bendable by previously forming, for example, grooves or slits on the base substrate 101.

The height Hb of the base substrate 101 is larger than or equal to the height Ha of the wiring 103 of the wiring portion 1101. It is favorable that the material of the base substrate 101 has such a hardness that, when a solder is melted during a flow process, the height of the solder can be regulated by the base substrate 101. Since, usually, the height of a solder is about 0.05 millimeters (mm) to 0.5 mm, it is favorable that a difference between the height Hb of the base substrate 101 and the height Ha of the wiring 103 is smaller than or equal to 1 mm.

Although the thickness of the base substrate 101 differs depending on the material thereof, to secure as large a mounting area as possible, it is favorable that the base substrate 101 is thinner, but, since, in consideration of such a hardness that the height of a solder can be regulated, it is favorable that the difference is smaller than or equal to about 1 mm, it is favorable that the thickness of the base substrate 101 is smaller than or equal to 0.5 mm.

The wiring portion 1101 is arranged at a position where the electrode 222 of the wiring board 1001 other than the bendable coupling portion 107 and the wiring 103 of the wiring component 100 are electrically and mechanically connected to each other via a solder 210.

The wiring portion 1101 is a portion formed by bonding an insulating member 102-1, which has junction surfaces 200 and 201 and a wiring 103-1, and an insulating member 102-2, which has a winding 103-2, with an insulating adhesive 109. The wiring 103 is continuous from the junction surface 200 to the junction surface 201. The insulating member 102 is a rigid substrate formed from an insulating material, such as a glass fiber-containing epoxy resin. In consideration of, for example, an increase in high density of a mounted component and the securement of a mounting area, since it is favorable that the thickness of the wiring portion is smaller than or equal to about 5 mm, it is favorable that the thickness of the insulating member is smaller than or equal to about 2.5 mm.

The wiring portion 1101 can have a reed shape cut into a long quadrangular shape. The size of the wiring portion 1101 is designed as appropriate according to, for example, the respective board sizes or electrodes of the wiring board 1001 and the wiring board 1002. It is possible to manufacture a large number of wiring portions 1101 from a large substrate without forming a wiring portion 1101 from a large substrate such as an integrated frame-like wiring component and discarding a substrate located inside the frame. The main wastes are chips occurring when a substrate is cut into a long quadrangular shape, so that it is possible to make an environmental load very small. Thinning the width of a blade of, for example, a dicing device for use in cutting enables further reducing chips and thus cutting down an environmental load.

The wiring 103 can be a metallic foil fixed by applying pressure or a metallic wire embedded in a groove (not illustrated), or can be formed by performing metallic plating on a through-hole machined by, for example, a drill or by applying an electrically conductive paste to the through-hole with, for example, a dispenser and performing burning. The shape of the wiring 103 can be circular or angular. The material of the wiring 103 can be an inorganic material, such as copper, silver, or aluminum, or an organic material, such as electroconductive rubber.

The wiring 103 of each wiring portion also includes a portion to be connected to a ground wiring of the wiring board 1001 or 1002. The ground wiring is required to be a more low-resistance wiring to allow a larger current to flow therethrough than a wiring such as a signal wire. To enable the wiring 103 of the wiring portion at the portion connected to the ground wiring of the wiring board 1001 or 1002 to allow a larger current to flow therethrough, a more low-resistance electrically conductive material made from a different material or a thick wire can be arranged. In consideration of the usage of, for example, a ground wiring or a signal wire, it is favorable that the width or thickness of the wiring 103 is 0.01 mm or more and 2 mm or less. In consideration of an increase in high density of the wiring, it is mover favorable that the width or thickness of the wiring 103 is 0.5 mm or less.

The outer circumference of the wiring component is made smaller than the outer circumference of each of the wiring boards 1001 and 1002. It is favorable that the width of the wiring component is as small as possible, because the area of a component able to be mounted on the wiring board becomes large.

The height of the wiring portion 1101 is made larger than that of a component largest in height, such as the electronic component 106. For example, in a case where a component with a height of 1.6 mm is mounted, it is favorable that the height H of the wiring component is 1.6 mm or more. The number of wirings and the pitch P thereof in the wiring component depend on the number of electrodes (not illustrated) and the pitch thereof in each of the wiring board 1001 and the wiring board 1002 for interconnection. The connection between the wiring component 100 and the wiring boards 1001 is implemented by a wiring at the side of the junction surface 200 of the wiring component 100 being connected to the electrode 222 of the wiring board 1001 via a solder 210. Similarly, the connection between the wiring component 100 and the wiring boards 1002 is implemented by a wiring at the side of the junction surface 201 of the wiring component 100 being connected to the electrode 220 of the wiring board 1002 via a solder 210.

FIGS. 7A1, 7A2, 7B1, 7B2, 7C1, 7C2, 7D1, 7D2, 7E1, and 7E2 are schematic diagrams illustrating a method for manufacturing a wiring component according to a sixth exemplary embodiment. FIGS. 7A1, 7B1, 7C1, 7D1, and 7E1 are top views of the wiring component. FIGS. 7A2, 7B2, 7C2, 7D2, and 7E2 are side views of the wiring component.

FIGS. 7A1 and 7A2 are diagrams illustrating four insulating members 102 (1021, 1022, 1023, and 1024), in which FIG. 7A1 is a top view and FIG. 7A2 is a side view. The insulating member 102 is a rigid substrate formed from an insulating material such as an epoxy resin. The insulating member 102 has a structure in which an insulating substrate, which supports a plurality of wirings 103-($a$), and an insulating substrate, which supports a plurality of wirings 103-($b$), are bonded to each other with an insulating adhesive 109. In the sixth exemplary embodiment, the height Ha' of the insulating member 102 is equal to the height Ha of the wiring 103 (Ha=Ha'). FIGS. 7B1 and 7B2 are diagrams illustrating a process of applying an insulating adhesive 108 to the surface of the insulating member 102 with, for example, printing or a dispenser. The insulating adhesive 108 can be an insulating adhesive made from, for example, an epoxy or a silicone. The insulating adhesive 108 can also be a sheet-like adhesive.

FIGS. 7C1 and 7C2 are diagrams illustrating a process of aligning a wiring portion 1101 with a base substrate 101 having a bendable coupling portion 107 by, for example, an alignment device (not illustrated) and then bonding the wiring portion 1101 to the base substrate 101. The method can perform alignment with use of a previously formed alignment work (not illustrated). Moreover, during bonding of the wiring portion 1101 to the base substrate 101, the method can arrange a height regulating material (not illustrated) in the adhesive 108 in such a manner that the thickness of the adhesive 108 becomes uniform and then perform bonding while controlling the height regulating material in such a manner that the thickness of the adhesive 108 becomes uniform.

FIGS. 7D1 and 7D2 are diagrams illustrating a process of forming the base substrate 101 into a frame shape by bending the base substrate 101 at bendable coupling portions 107. Positions to be bent can be previously marked with use of a marker (not illustrated). With regard to the bendable coupling portion 107, in a case where the material of the base substrate 101 is relatively hard and is difficult to bend, for example, grooves or slits can be previously formed at bendable coupling portions 107. Moreover, grooves or slits can be previously formed at regular intervals in the longitudinal direction on at least the whole surface of one side of the base substrate 101, so that the base substrate 101 can be processed in such a way as to be bendable at optional portions. In the sixth exemplary embodiment, the height Hb of the base substrate 101 (the coupling portion 107) is larger than each of the height Ha of the wiring 103 and the height Ha' of the insulating member 102 (Hb>Ha, Hb>Ha').

FIGS. 7E1 and 7E2 are diagrams illustrating a process of fixing a base substrate leading end portion 1111-1 and a base substrate trailing end portion 1111-2 by a corner connecting member 111 with an insulating adhesive 108 previously applied thereto. The base substrate leading end portion 1111-1 and the base substrate trailing end portion 1111-2 can be previously processed in such a way as to be able to be fitted and fixed to each other. The corner connecting member 111 only needs to be able to fix the base substrate leading end portion 1111-1 and the base substrate trailing end portion 1111-2, and can be made from the same material as that of the base substrate 101 or from an insulating material, such as an epoxy resin, Teflon®, or polyimide. Moreover, threaded holes can be previously formed in the corner connecting member 111 in such a way as to fix the base substrate leading end portion 1111-1 and the base substrate trailing end portion 1111-2 to the wiring board 1001 or the wiring board 1002 by screws. While it is favorable that the size of the corner connecting member 111 is small to secure as large a mounting area as possible, to fix the base substrate leading end portion 1111-1 and the base substrate trailing end portion 1111-2, a square with sides of about several mm is necessary and a square with sides of 2 mm or less is favorable.

The above-described processes enable implementing a wiring component which has high-density and narrow-pitch wirings and has a certain height and which is able to be easily manufactured with a little environmental load and a method for manufacturing the wiring component.

FIGS. 10A, 10B, 10C, 10D, 10E, and 10F are schematic diagrams illustrating an exemplary embodiment of a method for manufacturing an imaging module.

Figure 10A:
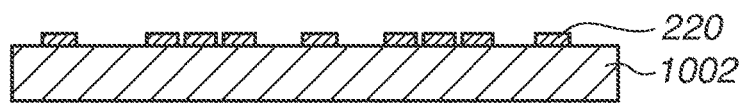
FIGS. 10A, 10B, 10C, 10D, 10E, and 10F are schematic diagrams illustrating a method for manufacturing a module.

FIG. 10A is a diagram illustrating a wiring board 1002 obtained before being supplied with a solder paste. The wiring board 1002 includes a plurality of electrodes 220. The electrode 220 is an electrode formed from a metal having electrical conductivity, such as copper, and is, for example, a signal electrode, a power electrode, a ground electrode, or a dummy electrode. The wiring board 1002 is a rigid board formed from an insulating material, such as an epoxy resin. A solder resist film (not illustrated) can be provided on the wiring board 1002. In that case, openings are formed in the solder resist film at positions corresponding to the electrodes 220. Furthermore, the shape of the electrode 220 can be angular or circular, and a relationship between the electrode 220 and the solder resist can be what is called Solder Mask Defined (SMD) or Non Solder Mask Defined (NSMD).

Figure 10B:
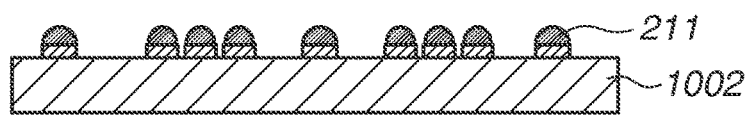

FIG. 10B is a diagram illustrating a process of placing, on the electrodes 220, a solder paste 211 containing solder powder and flux. The solder paste 211 can be supplied by, for example, screen printing or a dispenser. The solder paste 211 can be supplied in such a way as to completely coat the electrode 220 as illustrated in FIG. 10B or can be supplied in such a way as to partly coat the electrode 220.

Figure 10C:
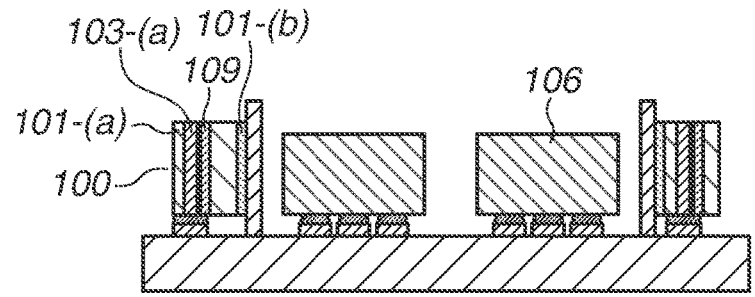

FIG. 10C is a diagram illustrating a process of placing, on the wiring board 1002, the electronic component 106, the wiring component 100, and a chip component (not illustrated). For example, the electronic component 106, a wiring portion 1101 of the wiring component 100, and the chip component (not illustrated) are placed on the respective predetermined electrodes 220 with use of, for example, a mounter.

Figure 10D:
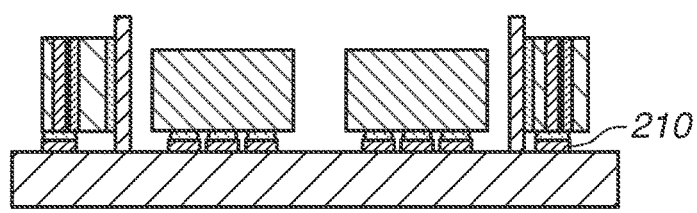

FIG. 10D is a diagram illustrating a process of heating the solder paste 211 to higher than or equal to a melting point of solder powder to fuse and agglutinate the solder powder and then cooling the solder paste 211 to lower than the melting point of solder powder to coagulate the solder power. The solder being coagulated causes each of the electronic component 106, the wiring component 100, the chip component (not illustrated) and the wiring board 1002 to be electrically and mechanically joined to each other. Furthermore, the process of heating and cooling a solder paste can be performed at, for example, a reflow furnace.

Since, with regard to the wiring component 100, the individual wiring portions 1101 thereof are formed into an integrated frame shape with the base substrate 101, the wiring portion 1101 is less likely to deviate or fall down due to, for example, vibration occurring at the time of handling or reflow after mounting of the wiring portion 1101. Particularly, even when the width of the wiring portion 1101 is small such as being less than or equal to 1 mm and the height thereof is greater than or equal to 2 mm, the wiring portion 1101 never falls down.

In a case where the respective wiring portions 1101 are arranged without use of the base substrate 101, the wiring portion 1101 may deviate or fall down due to, for example, vibration occurring at the time of handling or reflow after mounting of the wiring portion 1101. Particularly, when the width of the wiring portion 1101 is small, such as being less than or equal to 1 mm and the height thereof is greater than or equal to 2 mm, the probability of the wiring portion 1101 falling down increases.

Figure 10E:
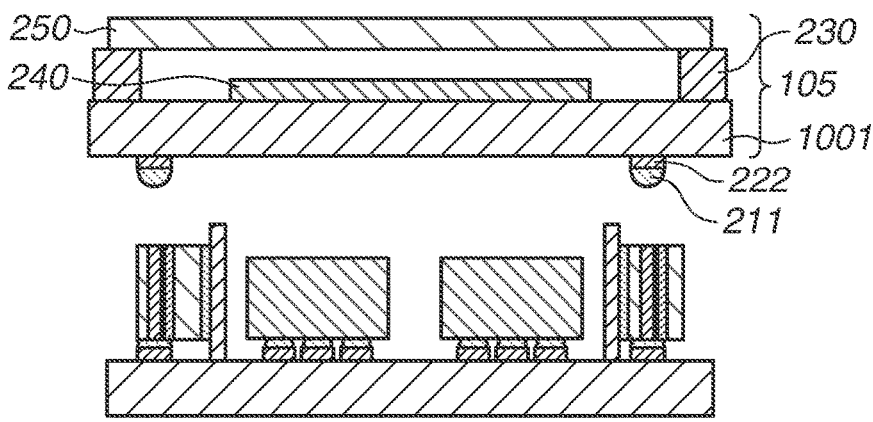

FIG. 10E is a diagram illustrating a process of placing a solder paste 211 containing solder powder and flux on an electrode 222 of the wiring board 1001, on which the unit 105 has been mounted, and mounting the wiring board 1001 on the wiring component 100 mounted on the wiring board 1002. The solder paste 211 can be supplied by, for example, screen printing or a dispenser. The solder paste 211 can be supplied in such a way as to completely coat the electrode 222 as illustrated in FIG. 10E or can be supplied in such a way as to partly coat the electrode 222. The wiring board 1001, on which the unit 105 has been mounted, is placed with use of, for example, a mounter in such a manner that the corresponding wirings 103 of the wiring component 100 are situated on the respective electrodes 222 of the wiring board 1001.

The electrode 222 is an electrode formed from a metal having electrical conductivity, such as copper, and is, for example, a signal electrode, a power electrode, a ground electrode, or a dummy electrode. The wiring board 1001 is a rigid board formed from an insulating material, such as ceramics or an epoxy resin. A solder resist film (not illustrated) can be provided on the wiring board 1001. In that case, openings are formed in the solder resist film at positions corresponding to the electrodes 222. Furthermore, the shape of the electrode 222 can be angular or circular, and a relationship between the electrode 222 and the solder resist can be what is called Solder Mask Defined (SMD) or Non Solder Mask Defined (NSMD).

Figure 10F:
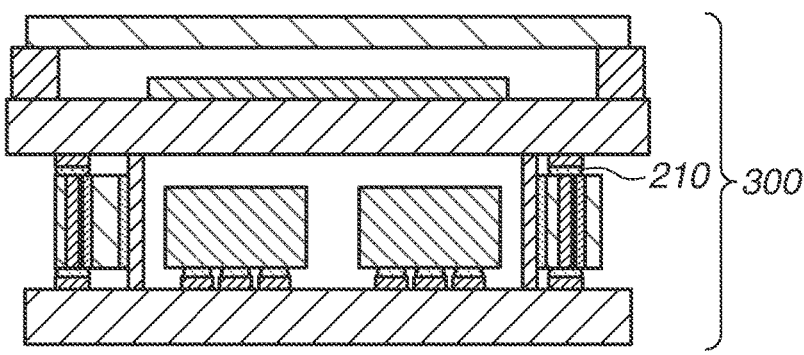

FIG. 10F is a diagram illustrating a process of heating the solder paste 211 to higher than or equal to a melting point of solder powder to fuse and agglutinate the solder powder and then cooling the solder paste 211 to lower than the melting point of solder powder to coagulate the solder power. The solder being coagulated causes each of the wiring board 1001, the wiring component 100, the chip component (not illustrated) and the wiring board 1002 to be electrically and mechanically joined to each other. Furthermore, the process of heating and cooling a solder paste can be performed at, for example, a reflow furnace.

The above-described processes enable manufacturing the module 300.

Example 1

A wiring component illustrated in FIGS. 6A to 6C was manufactured by using a manufacturing method described with reference to FIGS. 7A1 to 7E2. Referring to FIGS. 7A1 and 7A2, the wiring portion 1101 had a reed shape in which the length L was 41.0 mm, the thickness of the adhesive 109 was 0.085 mm, the thickness T was 1.085 mm, and the height Ha was 1.8 mm. The wirings 103 were formed as high-density interconnections in which the diameter of a copper wiring was 0.2 mm, the number of copper wirings was 140, and the nearest neighbor pitch P was 0.4 mm. The insulating member 102 was made from Flame Retardant Type-C (FR-4), and had an outer shape size of about 41.0 mm×1.8 mm and a thickness of 0.5 mm.

Next, as illustrated in FIGS. 7B1 and 7B2, an insulating epoxy-based adhesive 108 was applied with a thickness of about 0.2 mm to the surface of one side of the insulating member 102 by a squeegee printing method.

Next, as illustrated in FIGS. 7C1 and 7C2, four wiring portions 1101 were bonded to the base substrate 101, which was a copper plate with a thickness of 0.1 mm, with the respective centers thereof in the vertical direction aligned with each other and with the respective positions in the horizontal direction aligned with a marker (not illustrated).

The length of the base substrate 101 was 172 mm and the height Hb thereof was 0.2 mm.

Next, as illustrated in FIGS. 7D1 and 7D2, the base substrate 101 was bent at right angle at the respective centers of the bendable coupling portions 107 and was thus shaped in such a manner that the base substrate leading end portion 1111-1 and the base substrate trailing end portion 1111-2 came into contact with each other as viewed from the top. Scratch lines were previously formed at the respective centers of the bendable coupling portions 107.

Next, as illustrated in FIGS. 7E1 and 7E2, the base substrate leading end portion 1111-1 and the base substrate trailing end portion 1111-2 were fixed by the corner connecting member 111 and the insulating adhesive 108. The corner connecting member 111 was a square with sides of 1 mm and had a height of 1.8 mm. The material of the corner connecting member 111 was an insulating material such as a glass fiber-containing epoxy resin, which was the same as the material of a wiring board.

With the above-described processes, four wiring portions 1101, each of which had a reed shape in which the length L was 41.0 mm, the thickness of the adhesive 109 was 0.085 mm, the thickness T was 1.085 mm, and the height was 2.0 mm, were produced. Then, the wiring component 100 having high-density interconnections in which the number of copper wirings was 140 and the nearest neighbor pitch P was 0.4 mm was produced. The ratio between the height of the produced wiring component and the nearest neighbor pitch of wirings is 5:1 (2:0.4). The wiring density was 3.15 wires/mm$^2$ (140 wires/(41 mm×1.085 mm)).

Example 2

FIGS. 8A1, 8A2, 8B1, 8B2, 8C1, 8C2, 8D1, and 8D2 are schematic diagrams illustrating a wiring component and a method for manufacturing the wiring component in Example 2. FIGS. 8A1, 8B1, 8C1, and 8D1 are top views of the wiring component. FIGS. 8A2, 8B2, 8C2, and 8D2 are side views of the wiring component.

As illustrated in FIGS. 8A1 and 8A2, a Teflon®-coated base substrate 101 made from a metallic plate with a width of 0.1 mm, in which bendable coupling portions 107 had been formed by providing slits with a depth of 0.05 mm and a width of 0.1 mm, was used. Moreover, fitting portions with a length of 0.5 mm, a width of 0.4 mm, and a pitch of 0.8 mm were formed at the base substrate leading end portion 1111-1 and the base substrate trailing end portion 1111-2.

The length of the base substrate 101 was 172 mm and the height Hb thereof was 2.0 mm.

Next, as illustrated in FIGS. 8B1 and 8B2, the base substrate 101 was bent at right angle at the respective bendable coupling portions 107, so that the base substrate leading end portion 1111-1 and the base substrate trailing end portion 1111-2 were fitted and fixed to each other.

Next, as illustrated in FIGS. 8C1 and 8C2, an insulating epoxy-based adhesive 108 was applied with a thickness of about 0.2 mm to the surface of one side of the wiring portion 1101 by a squeegee printing method.

With regard to the wiring portion 1101, the insulating member 102 was made from FR-4, and, on both sides of the insulating member 102, copper wirings 103 were formed with the thickness of a copper foil being 0.015 mm, the width of an opening portion of the solder resist 104 being 0.2 mm, and the pitch thereof being 0.4 mm. The thickness of the solder resist 104 was 0.02 mm. The wiring portion 1101 had a reed shape in which the length L was 41.0 mm, the width W was 0.8 mm, and the height Ha was 1.8 mm, and was formed as high-density interconnections in which the number of copper wirings was 140 and the nearest neighbor pitch P was 0.4 mm.

Next, as illustrated in FIGS. 8D1 and 8D2, four wiring portions 1101 were bonded to the base substrate 101 with the respective centers thereof in the vertical direction aligned with each other and with the respective positions in the horizontal direction aligned with a marker (not illustrated). With the above-described processes, four wiring portions 110, each of which had a reed shape in which the length L was 41.0 mm, the thickness of the adhesive 109 was 0.085 mm, the thickness T was 0.8 mm, and the height was 2.0 mm, were produced. Then, the wiring component 100 having high-density interconnections in which the number of copper wirings was 140 and the nearest neighbor pitch P was 0.4 mm was produced. The ratio between the height of the produced wiring component and the nearest neighbor pitch of wirings is 5:1 (2:0.4). The wiring density was 3.15 wires/mm$^2$ (140 wires/(41 mm×1.085 mm)).

Example 3

FIGS. 9A, 9B, 9C1, and 9C2 are top views and a side view illustrating a wiring component in Example 3.

As illustrated in FIG. 9A, with regard to a wiring portion, through-holes with a diameter of 0.5 mm were drilled in an insulating member 102 with a thickness of 2 mm at a nearest neighbor pitch P of 0.6 mm, and wirings 103 were formed inside the through-holes with gold (Au)/nickel (Ni) non-electrolytic plating. The wiring product 100 was produced in the same way as that in Example 1 except the above.

As illustrated in FIG. 9B, with regard to the wiring portion 1101, the insulating member 102 was made from FR-4, and, on one side of the insulating member 102, copper wirings 103 were formed with the thickness of a copper foil being 0.015 mm, the width of an opening portion of the solder resist 104 being 0.2 mm, and the pitch thereof being 0.4 mm. The wiring portion 1101 had a reed shape in which the length L was 41.0 mm, the thickness T was 0.4 mm, and the height Ha was 1.8 mm, and was formed as high-density interconnections in which the number of copper wirings was 140 and the nearest neighbor pitch P was 0.4 mm. The wiring portion 1101 was bonded to both sides of the base substrate 101, and the base substrate leading end portion 1111-1 and the base substrate trailing end portion 1111-2 were fixed to each other at the outer side of a frame by the corner connecting member 111, so that the wiring component 100 was produced.

FIGS. 9C1 and 9C2 are diagrams illustrating a base substrate 101 in which a large number of bendable coupling portions 107 are formed. FIG. 9C1 is a top view of the base substrate 101. FIG. 9C2 is a side view of the base substrate 101. The base substrate 101 was produced in such a manner that grooves with a depth of 0.2 mm and a width of 0.2 mm were formed at a pitch of 0.4 mm on both sides of a copper plate with a length of 172 mm, a height of 2.0 mm, and a thickness of 0.45 mm. Portions to which the wiring portions were not bonded functioned as bendable coupling portions 107, so that the base substrate 101 was able to be bent at optional portions to be shaped into a frame shape. The wiring product 100 was produced in the same way as that in Example 1 except that the above-mentioned base substrate 101 was used (not illustrated).

With the above-described processes, a wiring component 100 having a reed shape in which the length L was 41.0 mm, the thickness of the adhesive 109 was 0.085 mm, the thickness T was 1.655 mm, and the height was 2.0 mm, was produced. The number of copper wirings was 280 and the nearest neighbor pitch P was 0.4 mm. The ratio between the height of the produced wiring component and the nearest neighbor pitch of wirings is 5:1 (2:0.4). The wiring density was 4.12 wires/mm$^2$ (280 wires/(41 mm×1.655 mm)).

Example 4

A module 300 illustrated in FIGS. 5A and 5B was manufactured with use of a wiring component produced in Example 1 by a manufacturing method described with reference to FIGS. 10A to 10F.

As illustrated in FIG. 10A, second electrodes 220, to which an electronic component 106 and a wiring component 100 were to be connected, were formed on the wiring board 1002. A solder resist (not illustrated) was formed on the upper surface of the wiring board 1002 in such a way as to partially coat the second electrodes 220. In the solder resist, connection opening portions, to which the electronic component 106 and the wiring component 100 targeted for mounting were to be connected, were provided at positions corresponding to the respective second electrodes 220, and the second electrodes 220 were exposed inside the connection opening portions.

With regard to the wiring board 1002, the insulating member 102 was made from FR-4, and the outer shape size of the wiring board 1002 is about 50.0 mm×50.0 mm. Moreover, the material of the second electrode 220 was copper, the diameter of the second electrode 220, which was to be connected to the wiring component 100, was 0.2 mm, and the second electrodes 220 were arranged in a staggered manner at a nearest neighbor pitch of 0.4 mm. Moreover, the thickness of the solder resist was about 0.02 mm. Solder balls were previously mounted on the back surface side of the electronic component 106, and the second electrodes 220, which were to be connected to the electronic component 106, were arranged at positions corresponding to the respective solder balls. Moreover, an electronic component such as a capacitor or a resistor (not illustrated) was previously mounted on the back surface side of the wiring board 1002. The outer shape size of the electronic component 106 was about 16.0 mm×16.0 mm and the height thereof was 1.6 mm.

Next, as illustrated in FIG. 10B, a solder past 211 was applied by screen printing in such a way as to coat the second electrodes 220 of the wiring board 1002. A printing plate with a thickness of 0.02 mm was used for screen printing.

The solder past 211 contained solder powder of tin (Sn), silver (AG), and copper (Cu) and flux. Moreover, the alloy composition of solder powder was a composition of tin-remnant, silver-3, and copper-3 with a melting point of 220° C., and the average particle diameter of solder powder was 40 micrometers (μm).

Next, as illustrated in FIG. 10C, the electronic component 106, the wiring component 100, and a chip component (not illustrated) were mounted on the wiring board 1002, to which the solder paste 211 had been supplied, with use of a mounter. Those were mounted in conformity with positions corresponding to the wirings 103 on the side of the junction surface 201 of the wiring portion 1101 of the wiring component 100 and the second electrodes 220 of the wiring board 1002. The electronic component 106 was mounted in conformity with positions corresponding to solder balls (not illustrated) of the electronic component 106 and the second electrodes 220 of the wiring board 1002. The wiring component 100 had a thickness T of 1.085 mm and, after being mounted on the wiring board 1002, stood by itself without the aid of, for example, any holding mechanism. Five wiring components 100 were arranged in such a way as to surround two electronic components 106.

Next, as illustrated in FIG. 10D, the wiring component 100 was put in a reflow furnace, so that the solder paste 211 was heated to higher than or equal to a melting point of solder powder to fuse and agglutinate the solder powder and was made into a solder 210.

Each of the electronic component 106, the wiring component 100, and the chip component (not illustrated) and the wiring board 1002 were electrically and mechanically joined to each other with the solder 210.

Next, as illustrated in FIG. 10E, first electrodes 222 of the wiring board 1001, to which a solder paste 211 had been applied by screen printing, were mounted in conformity with positions corresponding to wirings 103 on the side of the junction surface 200 of the wiring component 100 on the wiring board 1002. The unit 105 was configured in such a manner that an image sensor (imaging element) 240, a frame member 230, and a lid member 250 made from glass were mounted on the wiring board 1001. A solder resist (not illustrated) was formed on the back surface of the wiring board 1001 in such a way as to partially coat the first electrodes 222. In the solder resist, connection opening portions, to which the wiring component 100 was to be connected, were provided at positions corresponding to the respective first electrodes 222, and the first electrodes 222 were exposed inside the connection opening portions.

With regard to the wiring board 1001, the insulating member 102 was made from a low-thermal expansion coefficient wiring substrate, and the outer shape size of the wiring board 1001 is about 52.0 mm×52.0 mm. Moreover, the material of the first electrode 222 was copper, the diameter of the first electrode 222, which was to be connected to the wiring 103 of the wiring portion 1101 of the wiring component 100, was 0.2 mm, and the first electrodes 222 were arranged in a staggered manner at a nearest neighbor pitch of 0.4 mm.

Next, as illustrated in FIG. 10F, the module 300 was put in the reflow furnace, so that the solder paste 211 was heated to higher than or equal to a melting point of solder powder to fuse and agglutinate the solder powder and was made into a solder 210.

The wiring board 1001 and the wiring component 100 were electrically and mechanically joined to each other with the solder 210. This resulted in the electrodes 222 of the wiring board 1001, the electrodes 220 of the wiring board 1002, and the wirings 103 of the wiring portion 1101 of the wiring component 100 were electrically and mechanically joined to each other via the solder 210.

The above-described processes enabled manufacturing the module 300 using a wiring component in Example 4. In the manufactured module 300 serving as an imaging module, there were found neither detachment of the wiring component at the bonding surface thereof nor any solder junction failure, and the optical performance of a complementary metal-oxide semiconductor (CMOS) image sensor built in the wiring component was able to be sufficiently ensured.

Similarly, an imaging module was manufactured by using a wiring component produced in Example 2 or 3 and stacking a wiring board 1001 with an image sensor mounted thereon and a wiring board 1002 with, for example, an electronic component and a power source mounted thereon on each other. In the manufactured imaging module, there were found neither detachment of the wiring component at the bonding surface thereof nor any solder junction failure, and the optical performance of a CMOS image sensor built in the wiring component was able to be sufficiently ensured.

Comparative Example

In a comparative example, the particulars and processes thereof were the same as those in Example 4 except that the wiring portion 1101 in each of Examples 1 to 3 was used in such a way as to stand by itself without being bonded to a base substrate, a full-frame image sensor was used for the unit 105, and an imaging module was manufactured by stacking a wiring board 1001 and a wiring board 1002 with, for example, an electronic component and a power source mounted thereon on each other. The wiring component mounted on the wiring board 1002 fell down before being put in a reflow furnace or during reflow.

In the manufactured imaging module, short circuit, open, and solder junction failure of, for example, a solder ball frequently occurred, so that the optical performance of a CMOS image sensor built in the wiring component was not able to be sufficiently ensured. Moreover, even in an imaging module in which there was no solder failure, solder junction failure, such as open, occurred on the drop test, so that the optical performance of a CMOS image sensor built in the wiring component was not able to be sufficiently ensured.

Figure 11:
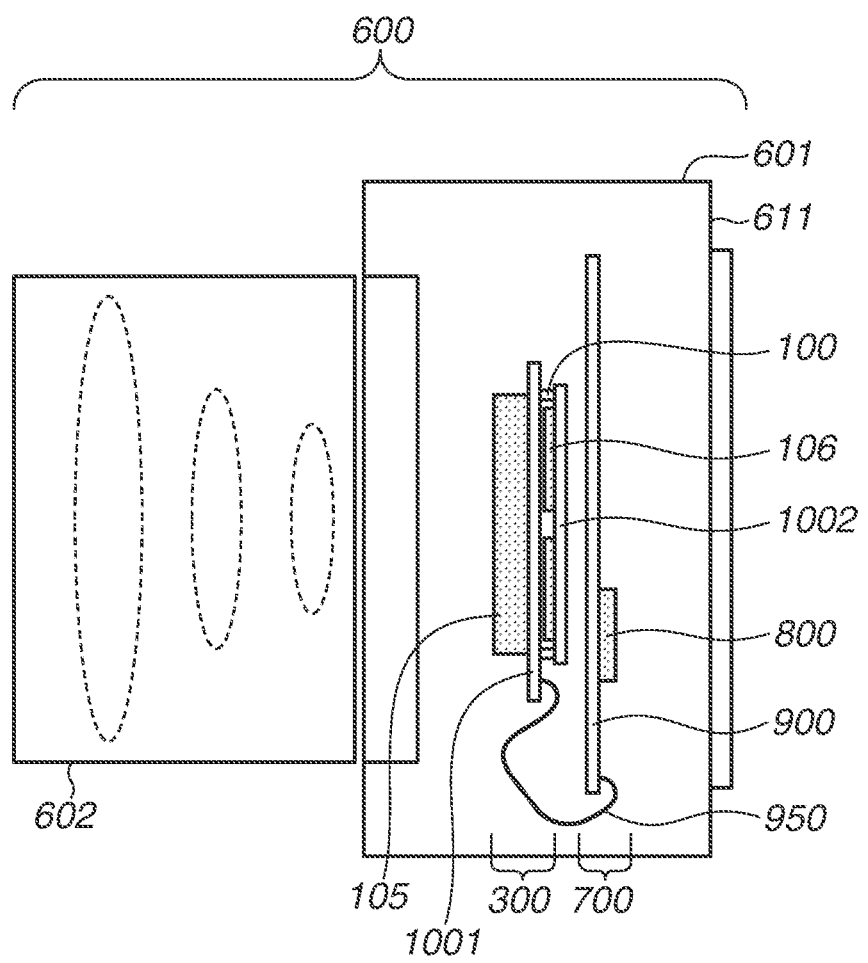
FIG. 11 is a schematic diagram illustrating an apparatus.

FIG. 11 is a diagram illustrating a digital camera 600 serving as an electronic apparatus, which is an example of an apparatus according to an exemplary embodiment of the present disclosure.

The digital camera 600 serving as an electronic apparatus is a lens-interchangeable digital camera, and includes a camera body 601. A lens unit (lens barrel) 602, which includes a lens, is attachable to and detachable from the camera body 601. The camera body 601 includes a casing 611, a module 300 provided and arranged inside the casing 611, and a circuit board 700. The module 300 and the circuit board 700 are electrically connected to each other by a cable 950.

The module 300 includes a wiring board 1001, on which a unit 105 is mounted, a wiring board 1002, on which a component with a certain height, such as an electronic component 106, is mounted, and a wiring component 100. The unit 105 includes an electronic component 240, which is an image sensor (imaging element), and a lid member 250. The wiring board 1001 and the wiring board 1002 are electrically connected to each other via the wiring component 100. The circuit board 700 includes an image processing device 800, which is an example of an electronic component, and a wiring board 900, on which the image processing device 800 is mounted.

The image sensor (imaging element) is, for example, a complementary metal-oxide semiconductor (CMOS) image sensor or a charge-coupled device (CCD) image sensor. The image sensor has the function of converting light incident through the lens unit 602 into an electrical signal.

The image processing device 800 is, for example, a digital signal processor. The image processing device 800 has the function of acquiring an electrical signal from the image sensor, performing processing for correcting the acquired electrical signal, and thus generating image data.

The above-described exemplary embodiments can be altered as appropriate within a range not departing from the illustrated technical idea. For example, some of the above-described exemplary embodiments can be combined. Moreover, some of particulars of at least one of the above-described exemplary embodiments can be deleted or replaced. Moreover, a new particular can be added to at least one of the above-described exemplary embodiments.

Furthermore, the disclosure content in the present specification includes not only particulars expressly described in the present specification but also all of the particulars which are understandable from the present specification and the drawings attached to the present specification. Moreover, the disclosure content in the present specification includes a complementary set of individual concepts described in the present specification. Thus, in a case where, for example, in the present specification, there is a description stating that "A is larger than B", even if a description stating that "A is not larger than B" has been omitted, it can be said that the present specification also discloses that "A is not larger than B". This is because, in the case of describing that "A is larger than B", taking a case where "A is not larger than B" into consideration becomes a premise.

According to aspects of the present disclosure, techniques advantageous for increasing the convenience of a wiring component can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-059053 filed Mar. 31, 2021, which is hereby incorporated by reference herein in its entirety.

What is claimed is:

1. A wiring component comprising:
   a first wiring portion including a first plurality of wirings arranged side by side in a first direction and including a first insulating member that supports the first plurality of wirings;

a second wiring portion including a second plurality of wirings arranged side by side in a second direction and including a second insulating member that supports the second plurality of wirings; and a coupling portion configured to couple the first wiring portion and the second wiring portion to each other, wherein an angle formed by the first direction and the second direction is changeable by deformation of the coupling portion, wherein the first wiring portion and the second wiring portion are composed of one or more first materials, wherein the one or more first materials are insulating materials, wherein the coupling portion is composed of one or more second materials, and wherein the one or more first materials are different from the one or more second materials.

2. The wiring component according to claim 1,
wherein the coupling portion configured to couple the first wiring portion and the second wiring portion to each other is a first coupling portion,
wherein the wiring component further comprises:
a third wiring portion including a third plurality of wirings arranged side by side in a third direction; and
a second coupling portion configured to couple the second wiring portion and the third wiring portion to each other, and
wherein an angle formed by the second direction and the third direction is changeable by deformation of the second coupling portion.

3. The wiring component according to claim 2, further comprising:
a fourth wiring portion including a fourth plurality of wirings arranged side by side in a fourth direction; and
a third coupling portion configured to couple the third wiring portion and the fourth wiring portion to each other,
wherein an angle formed by the third direction and the fourth direction is changeable by deformation of the third coupling portion.

4. The wiring component according to claim 1, wherein the deformation is plastic deformation.

5. The wiring component according to claim 1, wherein the first wiring portion and the second wiring portion are harder to deform than the coupling portion.

6. The wiring component according to claim 1, further comprising a base substrate provided over the first wiring portion and the second wiring portion, the base substrate being deformable.

7. The wiring component according to claim 6,
wherein the first wiring portion includes a first insulating member configured to support the first plurality of wirings of the first wiring portion,
wherein the first insulating member is bonded to the base substrate via an adhesive,
wherein the second wiring portion includes a second insulating member configured to support the plurality of wirings of the second wiring portion, and
wherein the second insulating member is bonded to the base substrate via an adhesive.

8. The wiring component according to claim 6,
wherein the first wiring portion includes a first insulating member configured to support the first plurality of wirings of the first wiring portion,
wherein the second wiring portion includes a second insulating member configured to support the second plurality of wirings of the second wiring portion, and
wherein the base substrate is located between the first insulating member and the second insulating member.

9. The wiring component according to claim 6, wherein a dimension of the base substrate in a direction intersecting with the first direction and the second direction is larger than or equal to a dimension of one of the first and second plurality of wirings in the intersecting direction.

10. The wiring component according to claim 9, wherein a distance between the first wiring portion and the second wiring portion is smaller than a dimension of the second wiring portion in a direction perpendicular to the second direction and the intersecting direction.

11. The wiring component according to claim 1, wherein the one or more first materials are stiffer than the one or more second materials.

* * * * *